United States Patent [19]

Sugano et al.

[11] Patent Number: 5,334,875
[45] Date of Patent: * Aug. 2, 1994

[54] STACKED SEMICONDUCTOR MEMORY DEVICE AND SEMICONDUCTOR MEMORY MODULE CONTAINING THE SAME

[75] Inventors: Toshio Sugano, Kokubunji; Kohji Nagaoka, Tobu; Seiichiro Tsukui, Komoro; Yoshiaki Wakashima, Kawasaki; Michio Tanimoto, Kokubunji; Masayuki Watanabe, Yokohama; Suguru Sakaguchi, Chigasaki; Kunihiko Nishi, Kokubunji; Aizo Kaneda, Yokohama; Kohji Serizawa, Fujisawa; Michiharu Honda, Yokohama; Tohru Yoshida, Yamato; Takeshi Komaru, Tachikawa; Atsushi Nakamura, Kokubunji, all of Japan

[73] Assignees: Hitachi, Ltd., Tokyo; Hitachi Tobu Semiconductor, Ltd., Saitama, both of Japan

[*] Notice: The portion of the term of this patent subsequent to Jul. 2, 2008 has been disclaimed.

[21] Appl. No.: 1,649

[22] Filed: Mar. 2, 1993

Related U.S. Application Data

[62] Division of Ser. No. 631,154, Dec. 20, 1990, Pat. No. 5,198,888, which is a division of Ser. No. 288,955, Dec. 23, 1988, Pat. No. 5,028,986.

[30] Foreign Application Priority Data

| Dec. 28, 1987 | [JP] | Japan | 62-332126 |
| Feb. 26, 1988 | [JP] | Japan | 63-42069 |
| Jun. 8, 1988 | [JP] | Japan | 63-139304 |
| Nov. 16, 1988 | [JP] | Japan | 63-287658 |

[51] Int. Cl.⁵ ............................................ H01L 23/16
[52] U.S. Cl. ............................ 257/686; 257/698; 257/700; 361/729; 361/744; 361/784
[58] Field of Search .......... 257/690, 686, 685, 723, 257/668, 698, 700; 437/208; 361/393, 396, 412

[56] References Cited

U.S. PATENT DOCUMENTS

| 4,300,153 | 11/1981 | Hayakawa et al. | 357/80 |
| 4,949,158 | 8/1990 | Ueda | 357/68 |
| 4,982,265 | 1/1991 | Watanabe et al. | 357/75 |
| 4,996,583 | 2/1991 | Hatada | 357/70 |
| 5,028,986 | 7/1991 | Sugano et al. | 357/75 |
| 5,198,888 | 3/1993 | Sugano et al. | 257/685 |

FOREIGN PATENT DOCUMENTS

| 52-75981 | 6/1977 | Japan | 357/75 |
| 59-136963 | 8/1984 | Japan | 357/75 |
| 60-22352 | 2/1985 | Japan | 257/75 |
| 60-191518 | 10/1985 | Japan | 357/75 |
| 62-113459 | 5/1987 | Japan | 357/75 |
| 62-144343 | 6/1987 | Japan | 357/75 |
| 63-198364 | 8/1988 | Japan | 357/75 |
| 1-71162 | 3/1989 | Japan | 357/75 |
| 1-170037 | 7/1989 | Japan | 357/75 |

Primary Examiner—Rolf Hille
Assistant Examiner—Minhloan Tran
Attorney, Agent, or Firm—Antonelli, Terry, Stout & Kraus

[57] ABSTRACT

There is a trend to increase that area of a device requiring a memory of large capacity, which is occupied by a semiconductor memory. This trend obstructs reduction of the size of the device. The present invention contemplates to provide a memory which can have a high integration, a high density and a large capacity while minimizing the mounting area. In order to achieve this memory, the TAB (Tape Automated Bonding) of the prior art is mounted on an electrically conductive connector, and a plurality of structures composed of the TAB and the connector are stacked. Moreover, the connector mounting the TAB thereon is constructed such that the independent terminals of the stacked TABs may not be shorted.

56 Claims, 35 Drawing Sheets

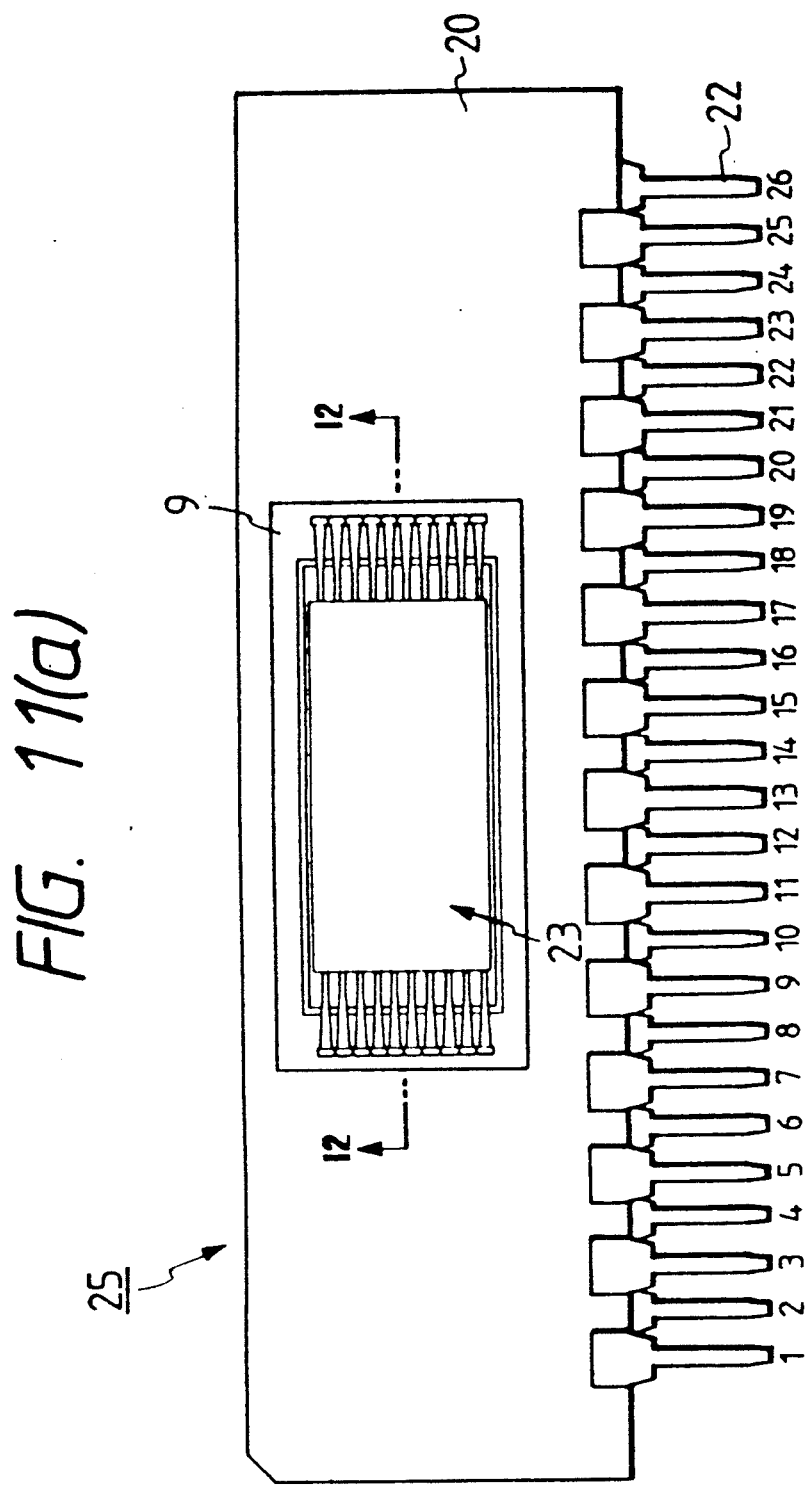

FIG. 11(b)

| PIN NO. | PIN NAME |
|---|---|
| 1 | Vss |
| 2 | $\overline{RAS0}$ |
| 3 | $\overline{RAS1}$ |
| 4 | NC |
| 5 | A9 |
| 6 | A0 |
| 7 | A1 |
| 8 | A2 |
| 9 | A3 |
| 10 | Vcc |
| 11 | DIN |
| 12 | DOUT |
| 13 | $\overline{WE}$ |
| 14 | $\overline{CAS}$ |
| 15 | Vcc |
| 16 | A4 |
| 17 | A5 |
| 18 | A6 |
| 19 | A7 |
| 20 | A8 |
| 21 | $\overline{RAS2}$ |
| 22 | $\overline{RAS3}$ |
| 23 | Vss |

FIG. 11(c)

| PIN NO. | PIN NAME |
|---|---|
| 1 | Vss |
| 2 | Dout0 |
| 3 | Din0 |
| 4 | Dout1 |
| 5 | Din1 |
| 6 | NC |
| 7 | A9 |
| 8 | A0 |
| 9 | A1 |
| 10 | A2 |
| 11 | A3 |
| 12 | Vcc |
| 13 | $\overline{RAS}$ |
| 14 | $\overline{CAS}$ |
| 15 | $\overline{WE}$ |
| 16 | Vcc |
| 17 | A4 |
| 18 | A5 |
| 19 | A6 |
| 20 | A7 |
| 21 | A8 |
| 22 | Din2 |
| 23 | Dout2 |
| 24 | Din3 |
| 25 | Dout3 |
| 26 | Vss |

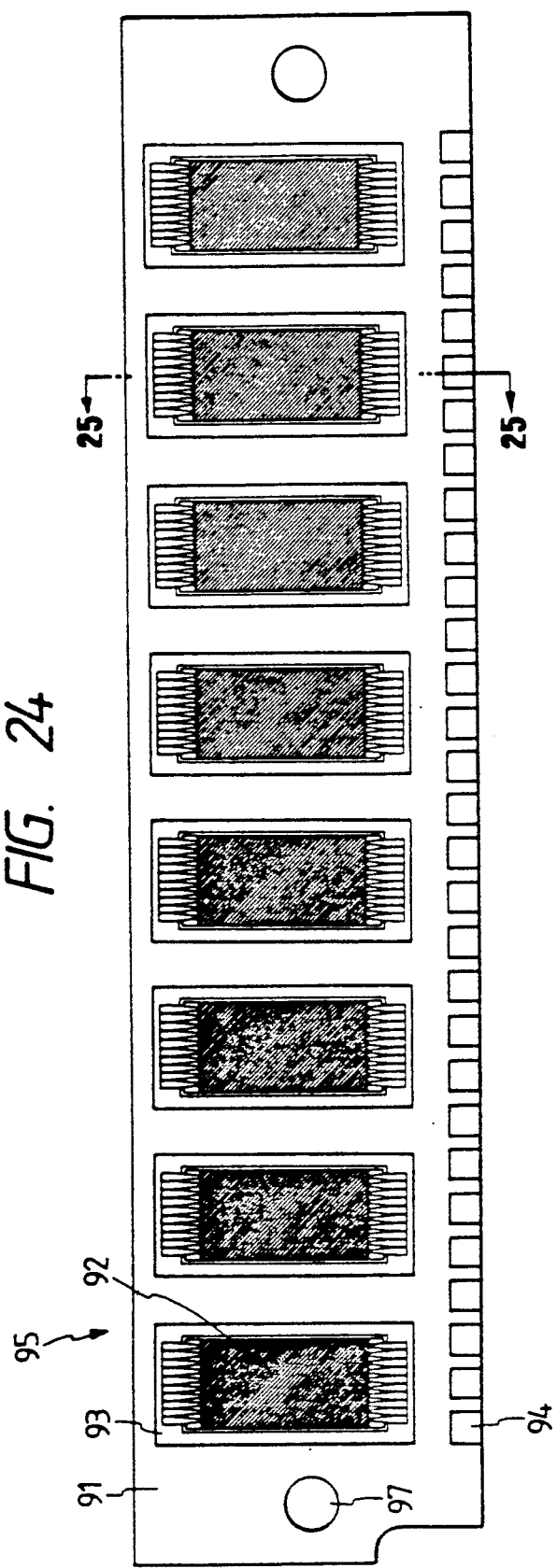
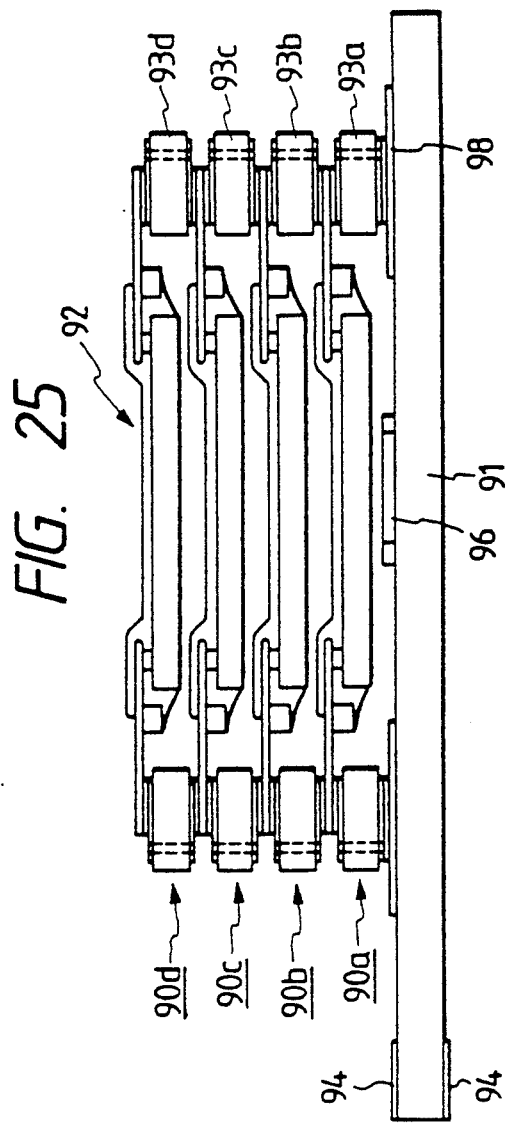

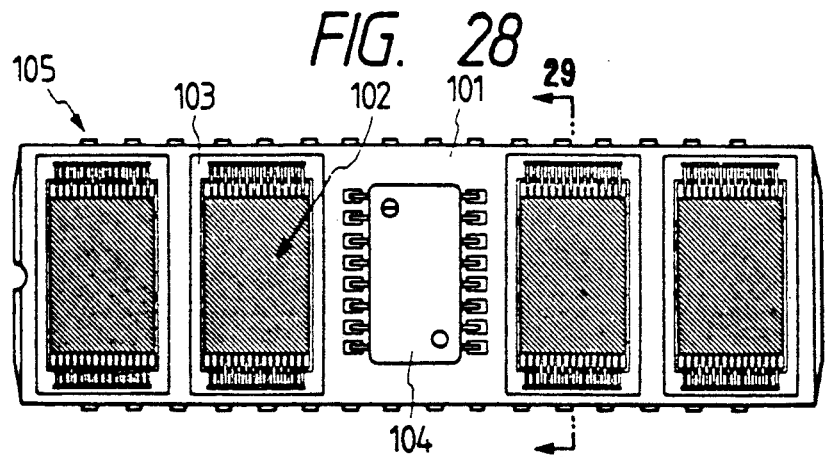
FIG. 28
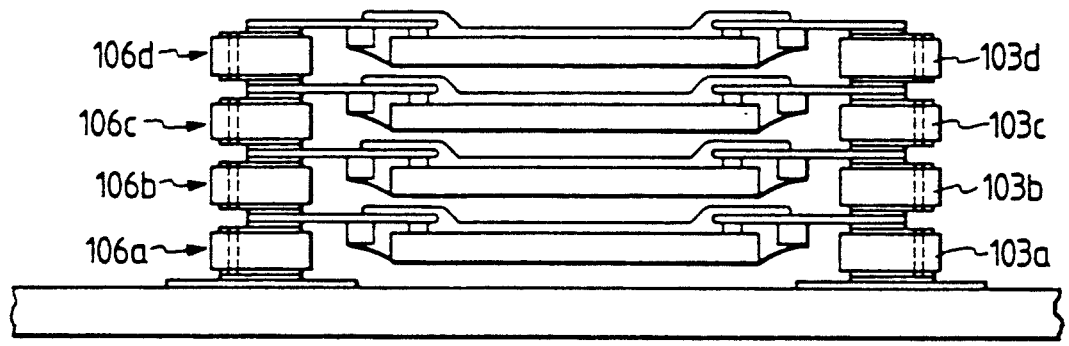
FIG. 29
FIG. 31
| A18 | 1 | 32 | VCC |
| --- | --- | --- | --- |
| 16 | 2 | 31 | A15 |
| A14 | 3 | 30 | A17 |
| A12 | 4 | 29 | WE |
| A7 | 5 | 28 | A13 |
| A6 | 6 | 27 | A8 |
| A5 | 7 | 26 | A9 |
| A4 | 8 | 25 | A11 |
| A3 | 9 | 24 | OE |
| A2 | 10 | 23 | A10 |
| A1 | 11 | 22 | CS |
| A0 | 12 | 21 | I/O7 |
| I/O0 | 13 | 20 | I/O6 |
| I/O1 | 14 | 19 | I/O5 |
| I/O2 | 15 | 18 | I/O4 |
| VSS | 16 | 17 | I/O3 |
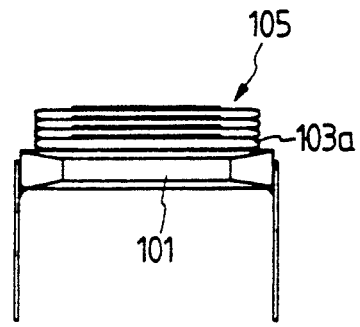
FIG. 30

MODULE BLOCK DIAGRAM

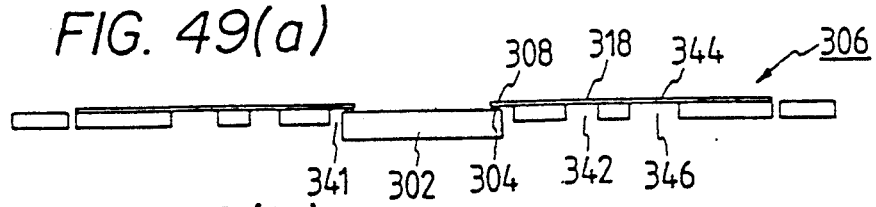
FIG. 49(a)
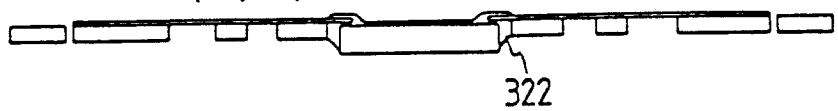
FIG. 49(b)
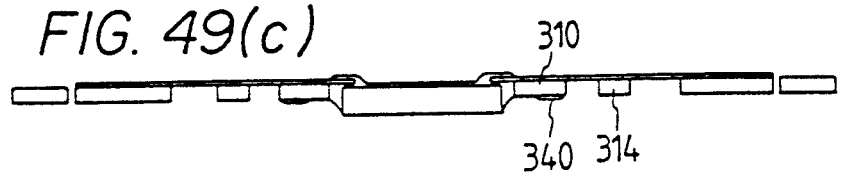
FIG. 49(c)
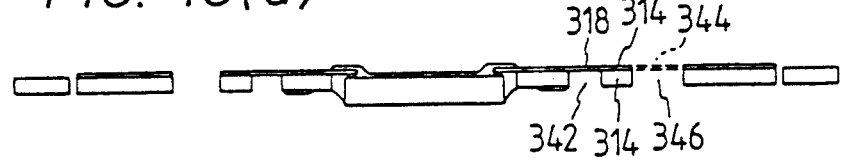
FIG. 49(d)
FIG. 49(d)'
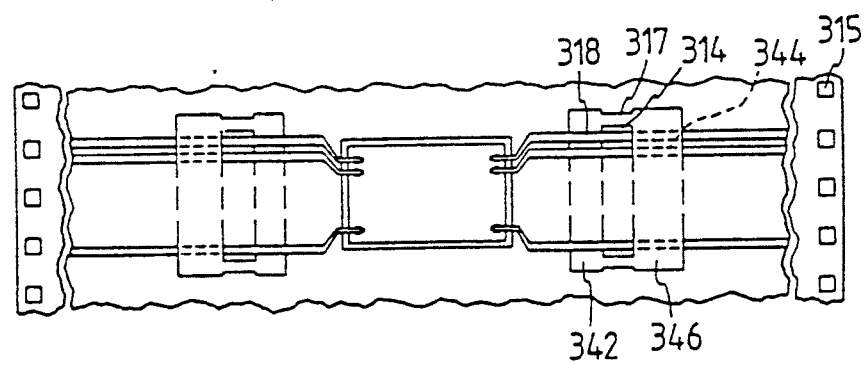
FIG. 49(e)
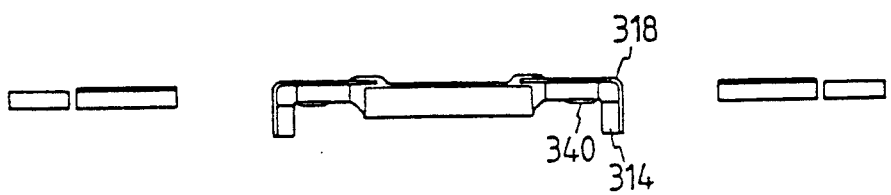
FIG. 49(f)
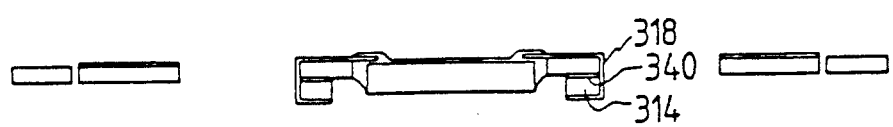

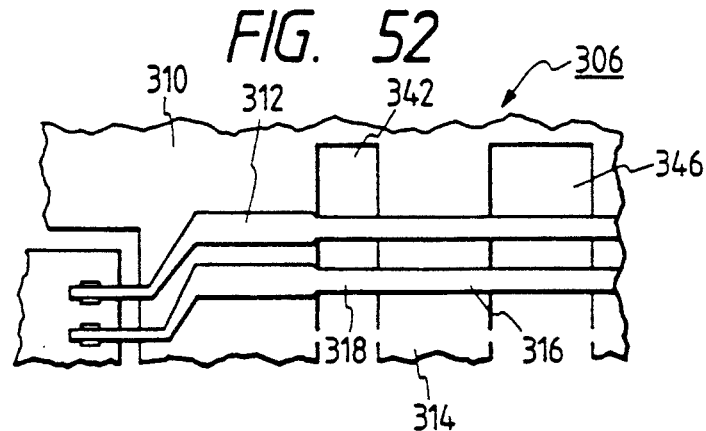
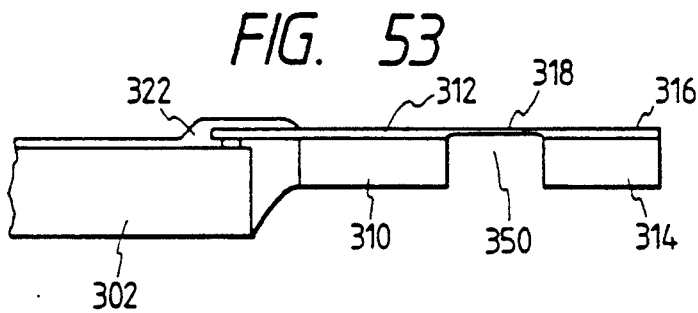
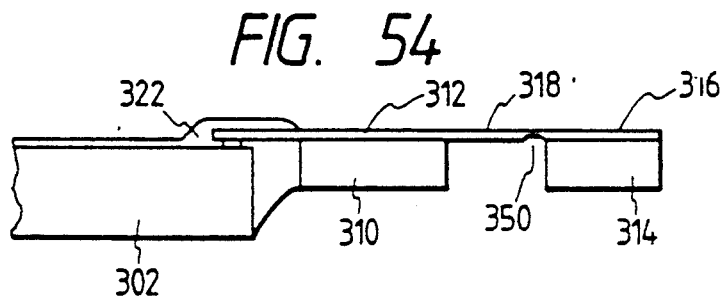
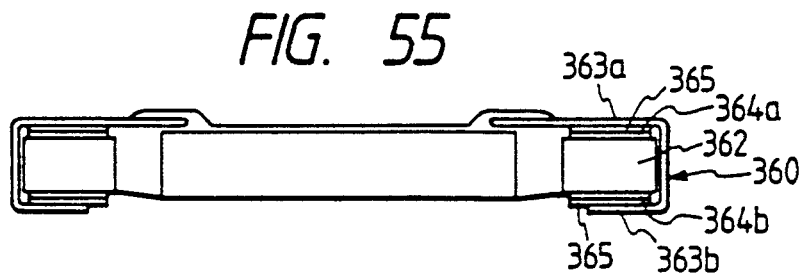
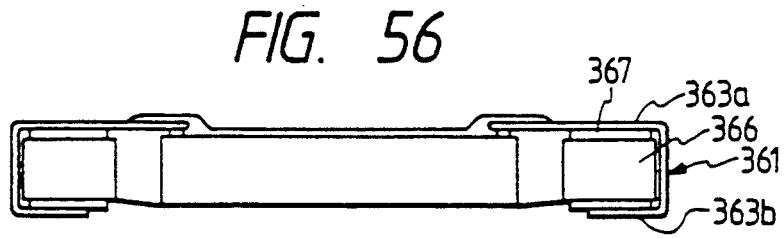

STACKED SEMICONDUCTOR MEMORY DEVICE AND SEMICONDUCTOR MEMORY MODULE CONTAINING THE SAME

This is a divisional of application Ser. No. 07/631,154filed Dec. 20, 1990, now U.S. Pat. No. 5,198,888 issued Mar. 30, 1993, which in turn is a divisional application of application Ser. No. 288,955, filed Dec. 23, 1988 and now U.S. Pat. No. 5,028,986 issued Jul. 2, 1991.

BACKGROUND OF THE INVENTION

The present invention relates to a structure of a semiconductor device and a process for fabricating the same and, more particularly, to a large-capacity multi-chip semiconductor device which is enabled to have a memory capacity a plurality of times as large as that of a conventional IC package for the same mounting area by using film carriers.

A semiconductor memory is widely used in information devices such as a large-sized computer, a work station, a personal computer, a word processor or facsimile. The progressive performance and variety of these devices has resulted in an increased demand for the semiconductor memories to be used in the devices. In this meanwhile, the mounting area to be occupied by the semiconductor memories in a device requiring a memory of large capacity has a tended to increase, which raises the largest factor of blocking the reduction in the size and weight of the device. In order to solve this problem, it has been accomplished in the prior art to increase the capacity of the memory per chip by highly integrating the in-chip elements, to mount the packaged semiconductor module highly densely in a print-circuit board and to stack a plurality of semiconductor chips highly densely in the direction of thickness. Of these, the highly dense mounting on the printed substrate is accomplished mainly by arraying a plurality of faced mounting type semiconductor devices or TABs (i.e., semiconductor devices prepared by connecting semiconductor chips with the leads of a tape carrier by the TAB (Tape Automated Bonding) method and by connecting the respective leads of the TABs with signal wires on the printed substrate. Moreover, the method of stacking the plural semiconductor chips in the direction of thickness is accomplished by connecting the respective outer leads of single modules directly with the printed substrate.

Incidentally, the papers relating to those techniques are exemplified by Japanese Patent Laid-Opens Nos. 59 - 194460, 61 - 101067 and 62 - 195138.

SUMMARY OF THE INVENTION

We have examined the aforementioned mounting techniques to find out the following problems.

First of all, the high integration of the in-chip elements has come to a new aspect, which cannot be solved by the extension of the prior art, and requires developments of new techniques and production facilities.

Next, the highly dense mounting on the printed board is accomplished by mounting the TABs one by one on the substrate to raise a problem that the mounting area is enlarged, despite the merit that the TABs are far smaller and thinner than the semiconductor device in which the semiconductor chips are sealed up by the package.

Moreover, the method of stacking the plural semiconductor chips in the direction of thickness has been exemplified in the prior art by the method of connecting the respective outer leads of single modules directly with the mounting substrate or the method of using a frame having wires formed for the single modules, respectively, so as to lead out the respective signals of the modules. However, these methods are accompanied by a problem that the external size is enlarged or that the fabrication process is complicated.

An object of the present invention is to provide a semiconductor device having an increased mounting density.

Another object of the present invention is to provide a package structure having a memory capacity a plurality of times as large as that of the prior art for the same mounting area.

A further object of the present invention is to form the above-specified package structure by a simple fabrication process.

A further object of the present invention is to provide a memory module capable of mounting a number of semiconductor chips compactly.

The foregoing and other objects and novel features of the present invention will become apparent from the following description to be made with reference to the accompanying drawings.

The summary of the present invention to be disclosed hereinafter so as to achieve the above-specified objects will be briefly described in the following.

According to a first method, a semiconductor device having a memory capacity a plurality of times as large as that of the prior art for the same mounting area of the TABs is provided by stacking a plurality of semiconductor chips on the outer leads of the TABs formed by the TAB (Tape Automated Bonding) method while interposing connectors formed with wiring patterns. In the plural semiconductor chips to be stacked, specifically, the stacking is so accomplished that the terminals shared for signals may be connected through the respective wiring patterns of the connectors. Since, moreover, the chip selecting terminals left unshared have to lead in or out the signals separately to or from the semiconductor chips, only the wiring patterns of the connectors corresponding thereto are so staggered that they may not be shorted. As a result, the signals are fed to all the common terminals of the plural semiconductor chips by a single signal feed. When a signal is fed to one of the chip selecting terminals, only one of the plural semiconductor chips can be selectively used.

Since, according to this first method, the shared terminal can be fed with the signals by feeding it to one chip selecting terminal, the signal feed path may be the same as that of the prior art in which one TAB is mounted. In the present invention, a memory capacity of plural times can be achieved because the plural TABs are stacked. Since, moreover, the aforementioned connectors are as large as the TABs, a memory capacity of a plurality of times in the number of the stacked chips can be easily obtained with the mounting area of the prior art.

According to a second method, there are used the connectors with leads, which are constructed to achieve the aforementioned objects while omitting the assembly step of the TABs. Specifically, the connectors are formed directly with the leads given the same functions as those of the wiring patterns of the first method and are connected with semiconductor chips, which are formed with bump electrodes to be used with the TABs in the prior art, to form TABS with connectors. Since the lead terminals of the connectors of the TABs with the connectors according to this second method are constructed like the wiring patterns of the first method, the plural TABs can be stacked to achieve the object of providing the memory capacity of a plurality of times in the number of the TABs stacked.

According to a third method, on the other hand, square holes are formed outside of the device holes of the TAB method of the prior art, and the outer leads outside of the square holes are underlied by a bent base. Moreover, the leads positioned above the square holes are bent, and a frame base between the device holes and the square holes and the bent base are fixed by means of an adhesive. The portion of the frame base and the bent base has the same function of the aforementioned connectors. The leads are divided into leads connected with the terminals to be shared like the aforementioned connectors and Leads connected with the selecting terminals corresponding to the respective steps stacked. The TABs with the frame base according to this third method can achieve effects similar to those of the first method.

The aforementioned methods will be described in case four DRAMs (Dynamic Random Access Memories) of 1 mega bits are stacked. These DRAMs correspond to data input/output terminals, write enable ($\overline{WE}$) terminals address terminals; $\overline{CAS}$ (Column Address Strobe) terminals correspond to the aforementioned common terminals; and $\overline{RAS}$ (Row Address Strobe) terminals correspond to the chip selecting terminals. In case, moreover, the lowermost one of the stacked semiconductor chips is selected, the common terminals are connected by the wiring patterns of the aforementioned connectors so that the signals are fed to the individual steps by a single signal feed. Simultaneously with this, the signals are fed to the wiring pattern on the substrate connected with the $\overline{RAS}$ terminals. Since the wiring patterns of the aforementioned connectors connected with the chip selecting terminals are so formed that they may not be shorted, no signal is fed to the terminals of other steps by the single signal feed, as different from the common terminals.

In other words, the following effects can be attained by the means described above.

The memory capacity can be increased to the plural times of the stacked chips by making the package equal to or slightly thicker than the mounting area of the TABs of the prior art.

It is also possible to obtain the package which is suitable for the highly dense mounting.

Since, moreover, the chips are mounted on the connectors with the leads, the step of assembling the TABs can be omitted.

Furthermore, the fabrication process using the film carrier tape of the TAB method of the prior art can be applied to fabricate the memory module device of the present invention by a simple process.

BRIEF DESCRIPTION OF THE DRAWINGS

FIG. 11(a) is a top plan view showing one example of the semiconductor module;

FIGS. 11(b) and 11(c) are tables listing pin arrangements;

FIG. 24 is a top plan view showing one example of the semiconductor module;

FIG. 25 is a section taken along line B—B' of FIG. 24;

FIG. 26 is a side elevation showing the semiconductor module of FIG. 24;

FIG. 28 is a top plan view showing one example of the semiconductor module:

FIG. 29 is a section taken along line C—C' of FIG. 28.

FIG. 30 is a side elevation showing the semiconductor module of FIG. 28;

FIG. 31 is a diagram listing the pin arrangement of the semiconductor module of FIG. 28:

FIG. 34(a) and FIGS. 35 to 37(a) are side elevations showing the semiconductor device having connectors of different lead shapes;

FIGS. 49(a) to 49(g) and 49(d'), 49(g') are sections and top plan views showing the fabrication steps of the film carrier semiconductor device;

FIGS. 50 to 54 are enlarged top plan views and sections showing a potion of the film carrier semiconductor device;

FIGS. 55 and 56 are sections showing another example of the film carrier semiconductor device;

DESCRIPTION OF THE PREFERRED EMBODIMENTS

Embodiment I

Figure 1:
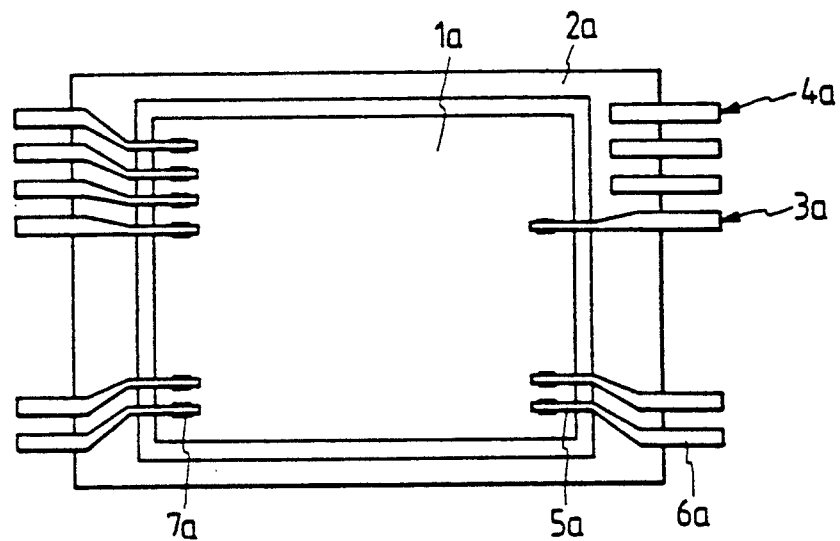
FIG. 1 is a top plan view showing a resinated TAB to be used in the semiconductor device of the present invention.

Hereinafter, parts having the same functions are designated at the same reference characters, and their repeated descriptions will be omitted.

The embodiment I of the present invention will be described in the following with reference to FIGS. 1 to 44.

Figure 2:
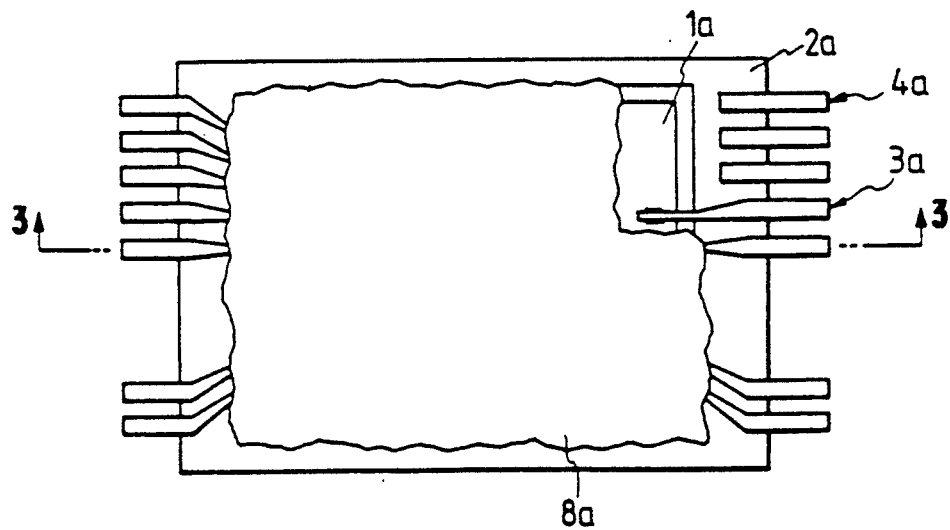
FIG. 2 is atop plan view showing a resinated TAB.
Figure 3:
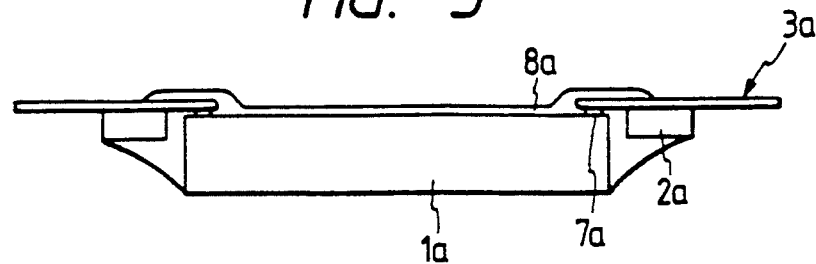
FIG. 3 is a section taken along line X—X' of FIG. 2.

With first reference to FIGS. 1 to 3, a semiconductor chip 1a having a desired circuit on the principal face of a single crystal silicon substrate is formed with bump electrodes 7a having a function as external terminals. A film carrier tape 2a made of polyimide or glass epoxy is formed with lead patterns 3a and 4a plated with Cu-Sn, Cu-solder or Cu-Ni/Au. The gold bumps 7a are electrically connected with the inner leads 5a of the lead pattern 3a. Outer leads 6a are extended to the outside of the semiconductor chip 1a.

In the TAB of the present invention, as shown in FIGS. 1 and 2, there are formed the dummy lead patterns 4a which are not electrically connected with the bumps 7a on the chip.

The semiconductor chip 1a is coated, on its upper face and its sides including the inner leads 5a, with a resin 8a for protecting the chip and its connecting portions. The coating resin 8a to be used may be an epoxy resin.

Figure 4:
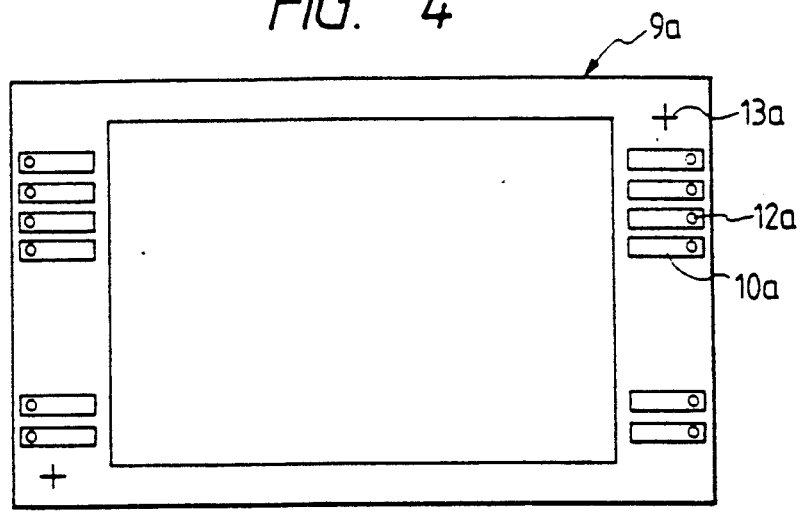
FIG. 4 is a top plan view showing a connector to be used in the semiconductor device of the present invention.
Figure 5:
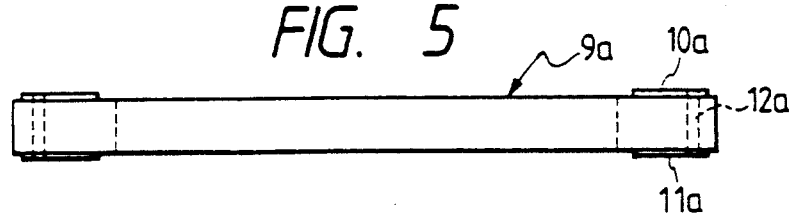
FIG. 5 is a side elevation of the connector.

In FIGS. 4 and 5, there is shown a connector 9a which is to be interposed between the individual TABs of FIGS. 1 to 3 in case the TABs are to be stacked. The connector 9a is made of a square glass epoxy resin or ceramics and formed at its central portion with a through opening within which the semiconductor chip is mounted. Moreover, the connector 9a is formed on its surface and back with a surface pattern 10a and a back pattern 11a which are plated with Cu, Cu-Ni/Au, Cu-solder or Cu-Sn solder. These two conductor patterns 10a and 11a are electrically connected through the through holes 12a. The connector 9a is further formed at its corners with positioning patterns 13a made of copper and is plated with a pattern of Mo-Ni/Au or W-Ni/Au in case it is made of ceramics.

Figure 6:
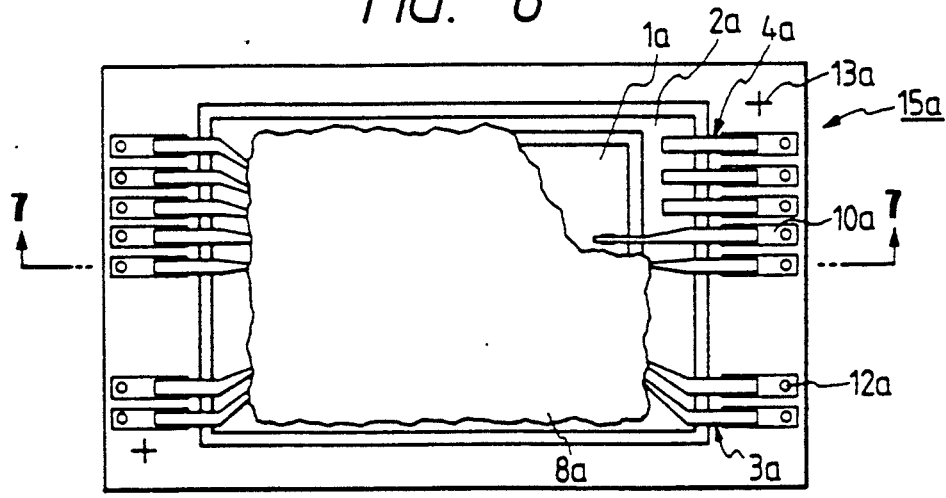
FIG. 6 is a top plan view showing a semiconductor device with the connector.
Figure 7:
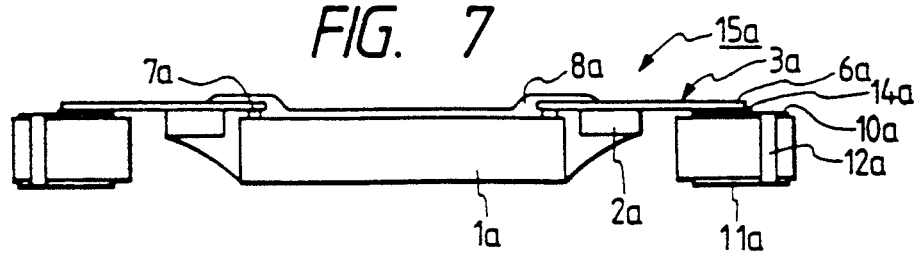
FIG. 7 is a section taken along line Y—Y' of FIG. 6.

FIGS. 6 and 7 show a semiconductor device 15a with a connector for constructing the present invention. This semiconductor device 15a is prepared by mounting the resinated TAB, as shown in FIG. 2, on the connector 9a of FIG. 4. The surface pattern 10a of the connector 9a and the aforementioned outer leads 6a are electrically connected through a first connecting layer 14a.

Figure 8:
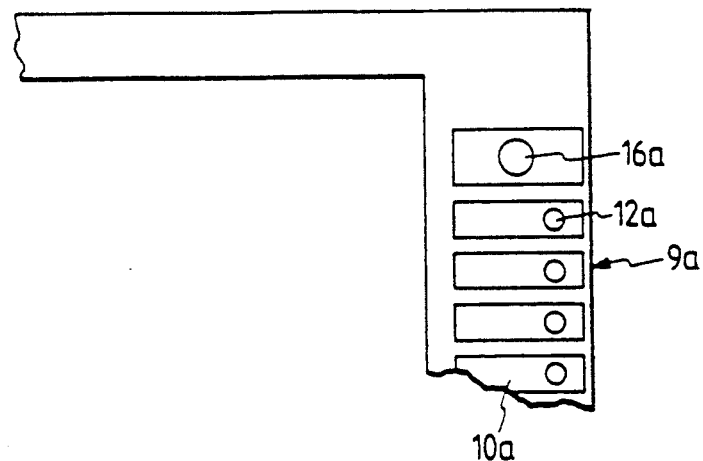
FIG. 8 is a top plan view showing a connector having a positioning hole.

FIG. 8 shows one example of the connector 9a, in which two positioning holes 16a are so formed at diagonally opposite positions of the connector 9a as to extend through the surface pattern 10a.

Figure 9:
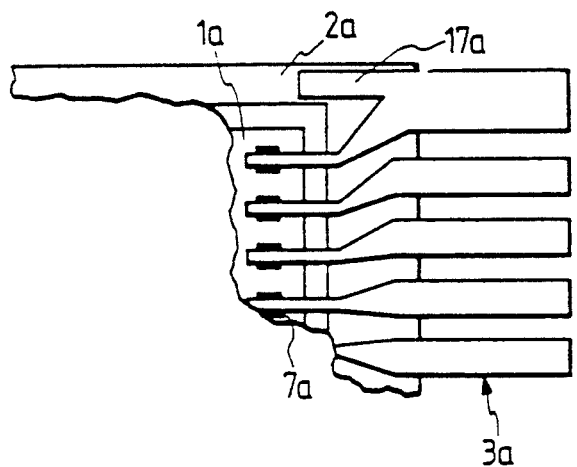
FIG. 9 is an enlarged view showing an essential portion of a TAB having a positioning pattern.

FIG. 9 shows a portion of the TAB which is to be mounted on the connector 9a of FIG. 8 and which has its lead pattern 3a formed with positioning holes 17a.

Figure 10:
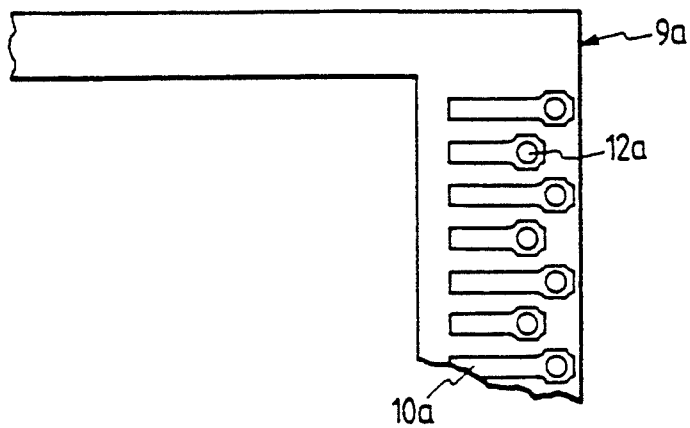
FIG. 10 is an enlarged view showing an essential portion of one example of the connector.

FIG. 10 shows another example of the connector 9a. The adjacent through holes 12a connecting the surface pattern 10a and the back pattern 11a are staggered. Thus, the respective pattern pitches of the surface and back patterns 10a and 11a of the connector 9a can be narrowed to reduce the size of the connector 9a.

The film carrier tape 2a to be used in the present invention is formed by slitting a polyimide resin film or glass epoxy resin with a suitable width. The lead pattern 3a can be formed by laminating a copper foil on the aforementioned film carrier tape and by the well-known photo resist technique or the etching technique.

The semiconductor chip 1a is constructed of a substrate of single crystal silicon and formed therein with a number of circuit elements by the well-known technique to have a desired circuit function.

The bump electrodes 7a are made of gold (Au) bumps, for example.

The resin 8a is comprised mainly of a liquid epoxy resin by the potting method.

FIGS. 11 to 33 show an example in which a multi-chip semiconductor device and a multi-chip semiconductor module are formed by using the semiconductor device having the connectors thus far described.

FIG. 11(b) shows the pin arrangement of one example using the semiconductor module of FIG. 11(a) and the corresponding pin functions.

FIG. 11(c) shows the pin arrangement of another example using the semiconductor module of FIG. 11 and the corresponding pin functions.

Figure 12:
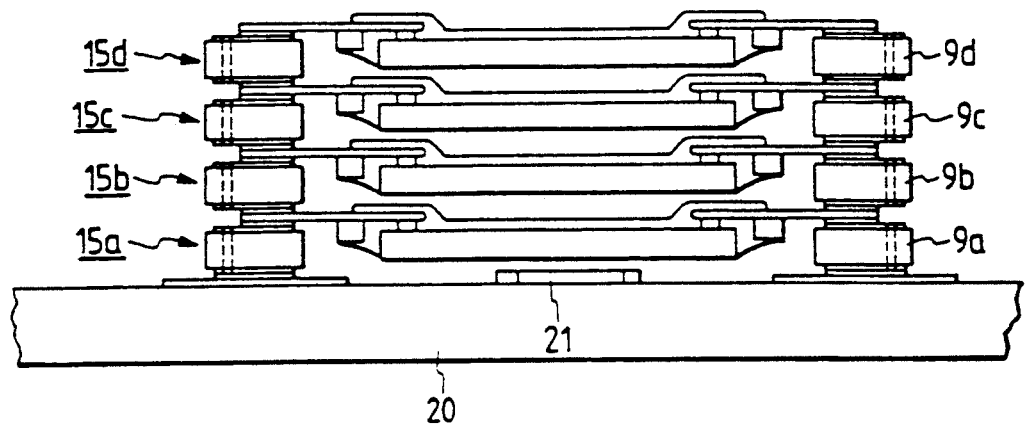
FIG. 12 is a section taken along line A—A' of FIG. 11.
Figure 13:
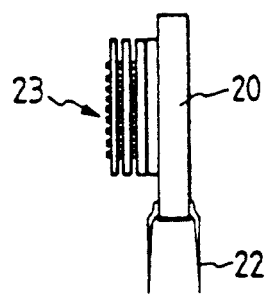
FIG. 13 is a side elevation showing the semiconductor module of FIG. 11.
Figure 14:
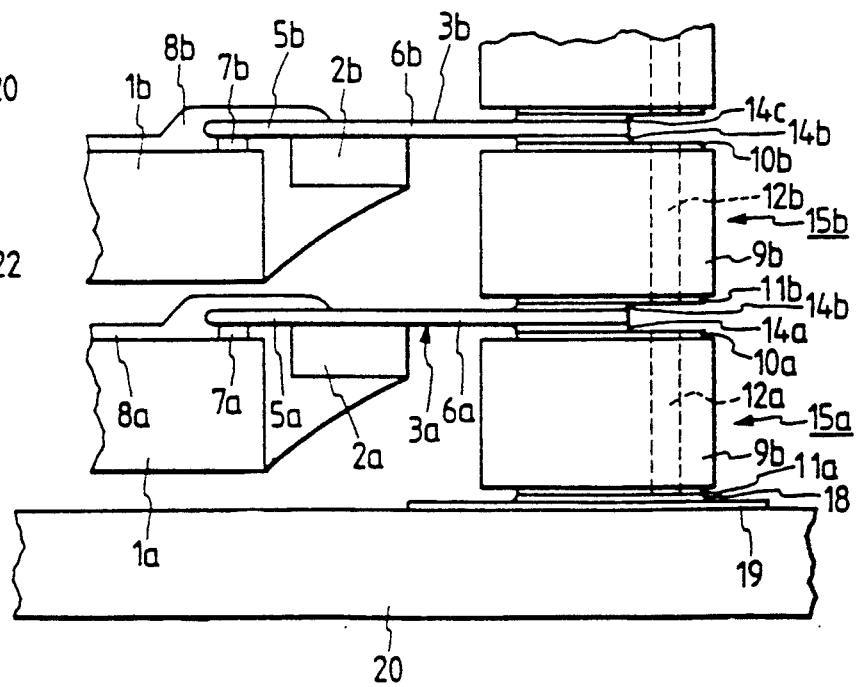
FIG. 14 is an enlarged section showing an essential portion of a semiconductor device having stacked connectors.

FIG. 14 is an enlarged section showing the connecting portion of the semiconductor devices with first and second lower connectors, in which the multi-chip semiconductor device of FIG. 12 is mounted on the substrate.

With first reference to FIGS. 11 to 14, the structure of a multi-chip semiconductor device 23 according to the present invention will be described in the following. In FIG. 2, four of the aforementioned semiconductor devices 15a to 15d with the connectors are stacked on a substrate 20 made of a glass epoxy material or ceramics and formed with a wiring pattern 19, to construct a semiconductor module 25 having a capacity of 4 mega bits and used as a memory as a whole. The substrate 20 is constructed to extract the respective signals of the semiconductor devices with the connectors through leads 22 which are lead out like the zigzag in-line type package (ZIP), for example.

In FIGS. 12 and 14, the back pattern 11a of the connector 9a of the lowermost semiconductor device 15a with the connector and the wiring pattern 19 plated with Cu-Ni/Au, Cu-solder or Cu-Sn are electrically connected through a third connecting layer 18 of solder. The second lower semiconductor device 15b and the lowermost semiconductor device 15a are electrically connected through a second connecting layer 14b of solder. Here in the case of the ceramic substrate, there is formed a conductor which is plated with Ag-Pd paste or W Mo-Ni/Au.

The second, third and fourth lower semiconductor devices 15b, 15c and 15d to be stacked have the same structure of the semiconductor device 15a of FIGS. 1 to 7 (i.e., the lowermost semiconductor device of FIG. 12). Throughout the drawings, the lowermost semiconductor device is suffixed by letter "a", and the second, third and fourth lower semiconductor devices are suffixed by letters "b", "c" and "d", respectively.

On the substrate 20 of the semiconductor module 25 of the present embodiment, moreover, there is mounted a capacitor chip 21 which has the function of a filter for reducing the noises of the power source.

In connection with the semiconductor modules of FIGS. 11 to 14 and in FIGS. 15, 16 and 11(b), one example (i.e., Application 1) using the multi-chip semiconductor device of the present invention will be described in the following.

Figure 15:
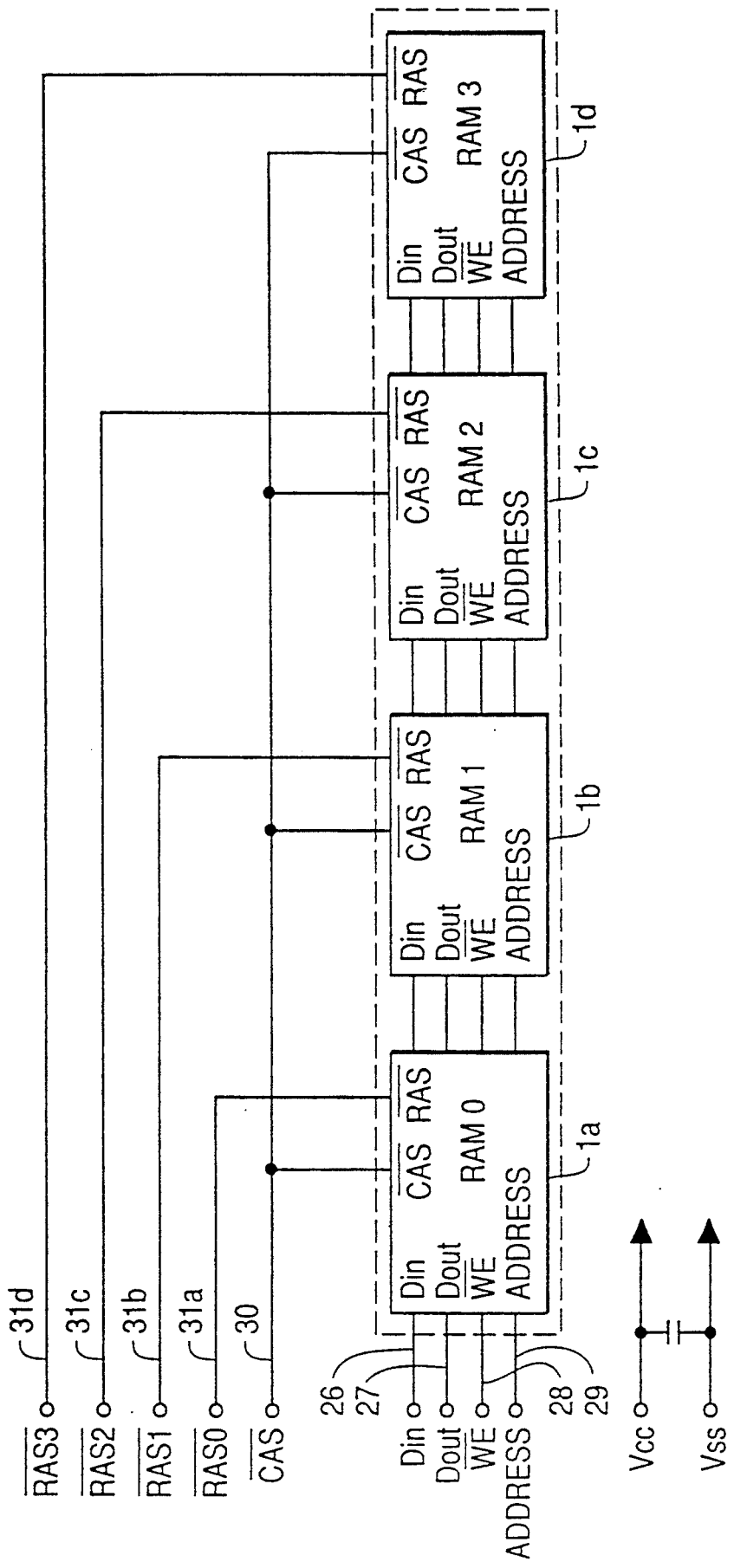
FIG. 15 is a block diagram showing the overall circuit of one example of the semiconductor module of the present invention.
Figure 16:
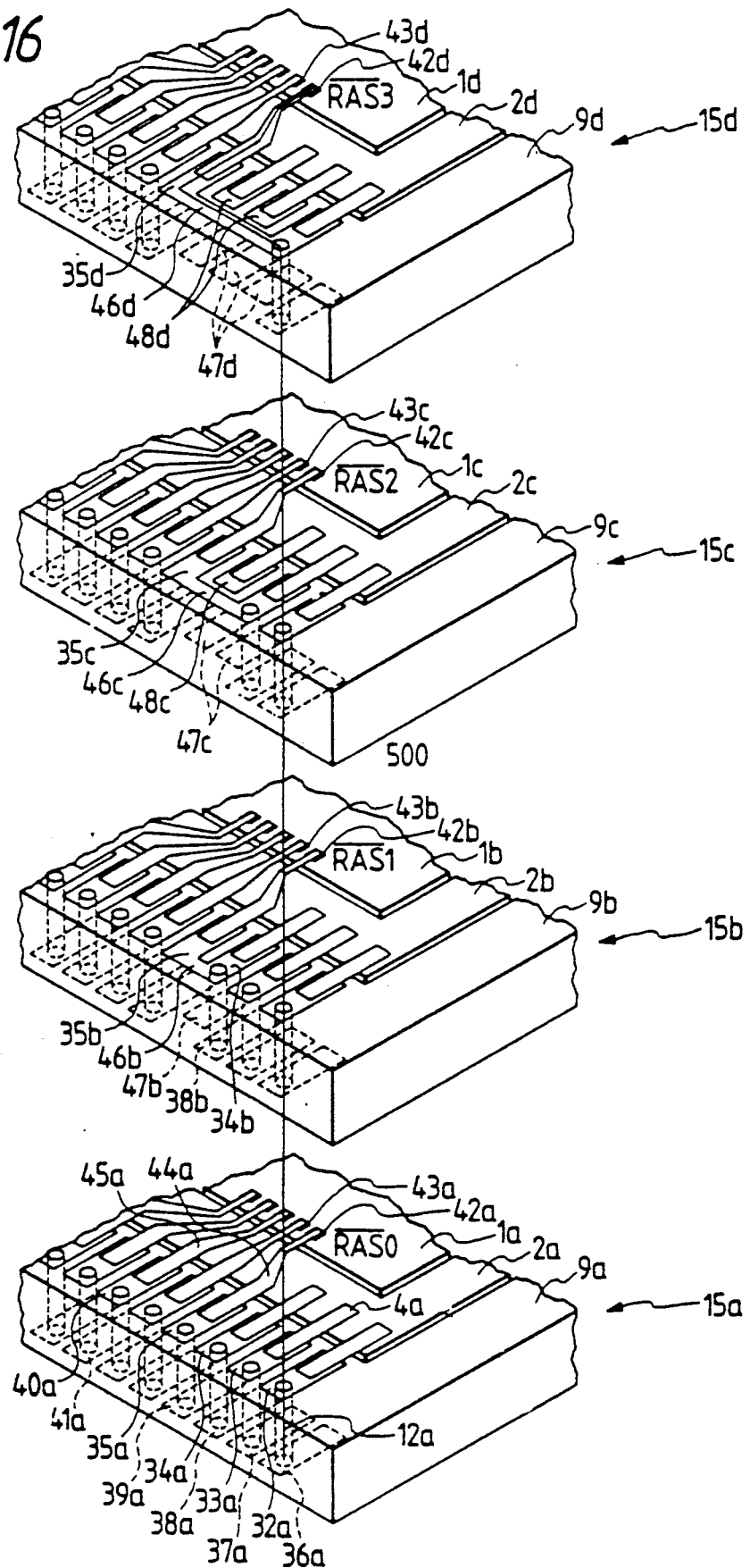
FIG. 16 is a perspective view showing an essential portion of the semiconductor device having stacked connectors according to FIG. 15.

The semiconductor module 25 having the pin arrangement of FIGS. 15, 16 and 11(b) is a memory module of 4 mega bits as a whole or a DRAM (Dynamic Random Access Memory) which constructs inputs and outputs of 4 mega bits×1 by using four semiconductor chips having 1 mega bits×1. Here, $\overline{RAS}$ (Row Address Strobe) selects the word lines, and $\overline{CAS}$ (Column Address Strobe) selects the column decoders. A0 to A9 designate address input pins, and $\overline{WE}$ designates write enable pin. Vcc and Vss designate power source terminals in a broad sense, and the terminal Vcc will be called the power source voltage terminal whereas the terminal Vss will be called the reference voltage terminal. Din and Dout designate data input/output terminals. FIG. 15 is a block diagram showing the overall circuit of the semiconductor module 25 having the pin arrangement of FIG. 11(b). The functions shown in FIG. 15 are omitted because they are similar to the aforementioned ones.

FIG. 16 presents perspective views showing the detail of the $\overline{RAS}$ terminal of the semiconductor module 25 for providing a capacity of 4 mega bits by stacking the semiconductor devices 15a to 15d. In the semiconductor devices 15a to 15d of FIG. 16, the parts having the same functions are designated by the same reference characters, as suffixed by "a" to "d".

FIG. 15 shows one example (i.e., Application I) using the Embodiment I. Each of the chips (RAM0 to RAM3) has a capacity of 1 mega bits and has its $\overline{CAS}$ terminal 30, data input terminal (Din) 26, data output terminal (Dout) 27, and $\overline{WE}$ terminal 28, address terminal 29 and power source terminals (Vcc and Vss) used commonly.

The write (or data input) and read (or data output) of information in and from the semiconductor memory chip are accomplished at each of addresses set in the chip. The write of information in a certain address requires an address signal for designating the address, a write enable signal for permitting the write, and a data signal containing data to be stored.

First in FIG. 15, data are written, if intended so, in the designated addresses of the individual chips by feeding the address terminal 29 with the signal for designating the address, the data input terminal 26 with the data signal to be written, the $\overline{WE}$ (Write Enable) terminal 28 with the low signal, and the $\overline{RAS}$ terminal 31 and the $\overline{CAS}$ terminal 30 with the signals. In case the data are to be read out, the data at the designated address are outputted from the data output terminal 27 by feeding the address terminal 29 with the signal for designating the address, the $\overline{WE}$ terminal 28 with the high signal and the $\overline{RAS}$ terminal 31 and $\overline{CAS}$ terminal 30 with the signals.

Next, the operations of the aforementioned structure will be described with reference to FIGS. 11 to 16.

In FIG. 16, the semiconductor chips 1a to 1d of the semiconductor devices 15a to 15d are formed on their upper faces with common terminal pads 43a to 43d and $\overline{RAS}$ terminal pads 42a to 42d (as designated by RAS0, RAS1, RAS2 and RAS3). In order to connect the semiconductor chips 1a to 1d and the corresponding connectors 9a to 9d, there are also formed common lead lines 45a to 45d, which are connected with the common terminal pads 43a to 43d, and $\overline{RAS}$ terminal lead lines 44a to 44d which are connected with the $\overline{RAS}$ terminal pads 42a to 42d. There is further formed the dummy lead 4a which is not electrically connected with the semiconductor chips 1a to 1d.

Next in the connectors 9a to 9d, there are formed on the surface of the connector 9a a common terminal pattern 40a, which is connected with the common lead line 45a for providing conduction between the upper and lower connectors, a $\overline{RAS}$ terminal pattern 35a, which is connected with the $\overline{RAS}$ terminal lead line 44a, and third, second and first $\overline{RAS}$ especial patterns 32a to 34a, which are connected with the respective leads of the dummy lead patterns 4a for burying the gap between the connectors connected. Here, the aforementioned common terminals include the address terminal, $\overline{WE}$ terminal, data input/output terminals (Din and Dout) and the power source terminals. On the back of the connector 9a, moreover, there are formed and electrically connected through the through holes 12a: back third to first $\overline{RAS}$ especial patterns 36a to 38a which are positioned to face the third to first $\overline{RAS}$ especial patterns 32a to 34a; a back $\overline{RAS}$ terminal pattern 39a which is positioned to face the $\overline{RAS}$ terminal pattern 35a; and a back common terminal pattern 41a which is positioned to face the common terminal pattern 40a.

Next, the surface of the connector 9b is formed in addition to the aforementioned patterns with a connection pattern for connecting a $\overline{RAS}$ terminal pattern 35b and a first $\overline{RAS}$ especial pattern 34b. The back of the connector 9b is formed with a back connection pattern 47b, which is positioned at the back $\overline{RAS}$ terminal pattern 39a of the connector 9a, such that the $\overline{RAS}$ terminal pattern 35b and the back connection pattern 47b are insulated from each other.

Moreover, the surface of the connector 9c is formed in addition to the patterns of the connector 9a with a connection pattern 46c for connecting a $\overline{\text{RAS}}$ terminal pattern 35c and a second $\overline{\text{RAS}}$ especial pattern 33c and a surface dummy pattern 48c which is positioned at the foregoing first $\overline{\text{RAS}}$ especial pattern 34a. The back of the connector 9c is formed with back connection patterns 47c at the positions of the back $\overline{\text{RAS}}$ terminal pattern 39a and back first $\overline{\text{RAS}}$ especial pattern 38a of the aforementioned connector 9a.

Moreover, the surface of the connector 9d is formed in addition to the patterns of the connector 9a with a connection pattern 46d for connecting a $\overline{\text{RAS}}$ terminal pattern 35d and a third $\overline{\text{RAS}}$ especial pattern 32d, and surface dummy patterns 48d which are positioned at the first and second $\overline{\text{RAS}}$ especial patterns 34a and 33a. The back of the connector 9d is formed with back connection patterns 47d which are positioned at the back $\overline{\text{RAS}}$ terminal pattern 39a and back first and second $\overline{\text{RAS}}$ especial patterns 38a and 39a of the connector 9a.

Here, the $\overline{\text{RAS}}$ terminal patterns 35c and 35d and a surface dummy pattern 48c are insulated from back connection patterns 47c and 47d.

In the semiconductor module 25 shown in FIGS. 11 to 14, the signals are fed from the outside to the wiring pattern 19 formed on the substrate 20 and further to the elements in the semiconductor chip 1a at the first step by way of the third connection layer 18 and the back pattern 11a, the through holes 12a, the surface pattern 10a and the first connection layer 14a of the connector 9a and via the outer leads 6a, the inner leads 5a and the bumps 7a. Simultaneously with this, the signals are fed to the semiconductor chip 1b at the second step, the semiconductor chip 1c at the third step and the semiconductor chip 1d at the fourth step.

Further description will be made with reference to FIG. 15. In the operations of writing certain data in a special address of the semiconductor chip 1a, for example, the address signal, the data signal, the write enable signal and the $\overline{\text{CAS}}$ signal are made effective only in the chip 1a of the four semiconductor chips 1a to 1d but not in the remaining chips 1b to 1d by feeding the address terminal 29 with the signal indicating the specified address, the data input terminal 26 with the data signal to be written, the $\overline{\text{WE}}$ (write enable) terminal 28 with the write enable signal, and simultaneously the $\overline{\text{RAS}}$ terminal (RAS0) 32a leading to the semiconductor chip 1a and the $\overline{\text{CAS}}$ terminal 30 with the signals. Specifically, the specified address of the semiconductor chip 1a is written with the necessary data, whereas the remaining three semiconductor chips unselected have their specified addresses unchanged.

For reading out the data, the read allowance signal is fed to the $\overline{\text{WE}}$ terminal 28, and the data stored in the specified address of the semiconductor chip 1a are outputted to the data output terminal 27 with the other terminals being connected in the same state.

In case the memory capacity is thus increased by multiplexing two or more chips, the terminals for selecting the chips can be provided independently of the individual chips to use all the remaining chips commonly.

Next, the operations of the structure of FIG. 15 will be described with reference to FIG. 16.

The feed paths of the signals are described hereinbefore, and the common signals terminals, i.e., the $\overline{\text{CAS}}$ terminal 30, the data input terminal 26, the data output terminal 27, the $\overline{\text{WE}}$ terminal 28, the address terminal 29 and the Vcc and Vss of FIG. 15 correspond to the common terminal pads 43a to 43d and the common lead lines 45a to 45d. On the other hand, the $\overline{\text{RAS}}$ terminal 31a (RAS0) corresponds to the $\overline{\text{RAS}}$ terminal pad 42a and the $\overline{\text{RAS}}$ terminal lead line 44a. The remaining $\overline{\text{RAS}}$ terminal 31b, 31c and 31d (RAS1, RAS2 and RAS3) correspond to the $\overline{\text{RAS}}$ terminal pads 42b to 42d and the $\overline{\text{RAS}}$ terminal lead lines 44b to 44d, respectively.

As shown in FIG. 16, more specifically, the signals to be fed to the common terminals are fed to the semiconductor chip 1a at the first step from the wiring pattern 19 of the substrate 20 through the back common terminal pattern 41a, the through holes 12a, the common terminal pattern 40a and the common lead line 45a of the connector 9a and further to the semiconductor chip 1b from the back common terminal pattern 41b of the connector 9b at the second step through the common lead line 45b. Simultaneously with this, the signals are fed to the individual chips.

In the case of the $\overline{\text{RAS}}$ terminal pad 42a at the first step, on the contrary, the signal is fed to the $\overline{\text{RAS}}$ terminal 42a via the back $\overline{\text{RAS}}$ terminal pattern 39a, the through holes 12a, the $\overline{\text{RAS}}$ terminal pattern 35a and the $\overline{\text{RAS}}$ terminal lead line 44a of the connector 9a. Since, however, the $\overline{\text{RAS}}$ terminal pattern 35a is not connected with the $\overline{\text{RAS}}$ terminal pattern 35b of the connector 9b at the second step, the signal fed to the $\overline{\text{RAS}}$ terminal pad 42a at the first step is not supplied to the semiconductor chip 1b.

Likewise, the signal is fed to the $\overline{\text{RAS}}$ terminal pad 42b at the second step via the back first $\overline{\text{RAS}}$ especial pattern 38a, the through holes 12a and the first $\overline{\text{RAS}}$ especial pattern 34a and further via the back first $\overline{\text{RAS}}$ especial pattern 38b, the through holes 12b, the first $\overline{\text{RAS}}$ especial pattern 34b, the connection pattern 46b, the $\overline{\text{RAS}}$ terminal pattern 35b and the $\overline{\text{RAS}}$ terminal lead line 44b. In this case, too, the $\overline{\text{RAS}}$ terminal patterns 35a and 35c at the first and third steps are not electrically connected with the $\overline{\text{RAS}}$ terminal pattern 35b at the second step.

In other words, the patterns are so formed that the $\overline{\text{RAS}}$ terminals of the chips at the third and fourth steps may not be connected with each other. Thus, the $\overline{\text{RAS}}$ terminals of the individual chips are made electrically independent of one another.

The surface dummy patterns 48c and 48d at the third and fourth steps are not connected with any terminal. Reference numeral 500 designates one example of the path of the signals to be fed to the RAS 3.

The connectors and substrate to be used in the present Embodiment I are made of a glass epoxy material or ceramics, for example. Moreover, the patterns to be formed on the connectors are prepared by plating the connectors with copper and then solder, Ni or Au.

The through holes have their inner walls formed by plating them with copper and processed like the aforementioned patterns. Thus, the surface and back patterns are electrically connected.

Here, the individual connectors themselves and the substrate and each of the connectors are connected by solder (of Pb-Sn). for example. Specifically, the connectors themselves are connected by solder (e.g., 90Pb-10Sn) having a higher melting point (e.g., about 300° C.), and the substrate and each connector are connected by solder (e.g., 40Pb-60Sn) having a lower melting point (e.g., about 180° C.). Despite of this fact, however, those connecting materials should not be limited to the above-specified solders but can be a solder comprised mainly of gold-tin (Au-Sn), gold or conductive paste (e.g., Ag paste).

The use of the connectors of the application 1 of the present Embodiment I makes it possible to provide a package structure having a memory capacity of four times for the same mounting area as that of the package of the prior art. Specifically, the connectors of the application 1 have such a structure as can select a specified one of the four semiconductor chips to feed the specified signals to the selected semiconductor chip only, and are stacked so that a memory capacity of four times can be provided for the same mounting area. Moreover, the memory module of the present invention can be provided merely by forming the surface and back patterns of the connectors for the first to fourth steps without any change in the layout of each chip, the pad arrangement and the lead arrays on the film carrier. By providing the dummy leads, furthermore, any clearance can be prevented from being formed between the layers of the connectors stacked to realize the electric connections of the connectors reliably with a high yield.

In the present Embodiment I, on the other hand, the surface and back patterns of the connectors are rendered conductive through the through holes in case the semiconductor devices having connectors are to be stacked. Thus, the patterns have their surfaces and backs connected through the through holes of the connectors but insulated at portions other than the through holes so that signals can be fed by selecting only the terminals for selecting the chips while using the common terminals as they are. As a result, the object of obtaining a module having a larger memory capacity than that of the prior art can be achieved by mounting the stacked chips highly densely according to the present invention and by using the stacked chips individually.

Next, another application 2 of the present Embodiment I will be described with reference to FIGS. 11 to 14, Table 2 and FIGS. 17 and 18.

Figure 17:
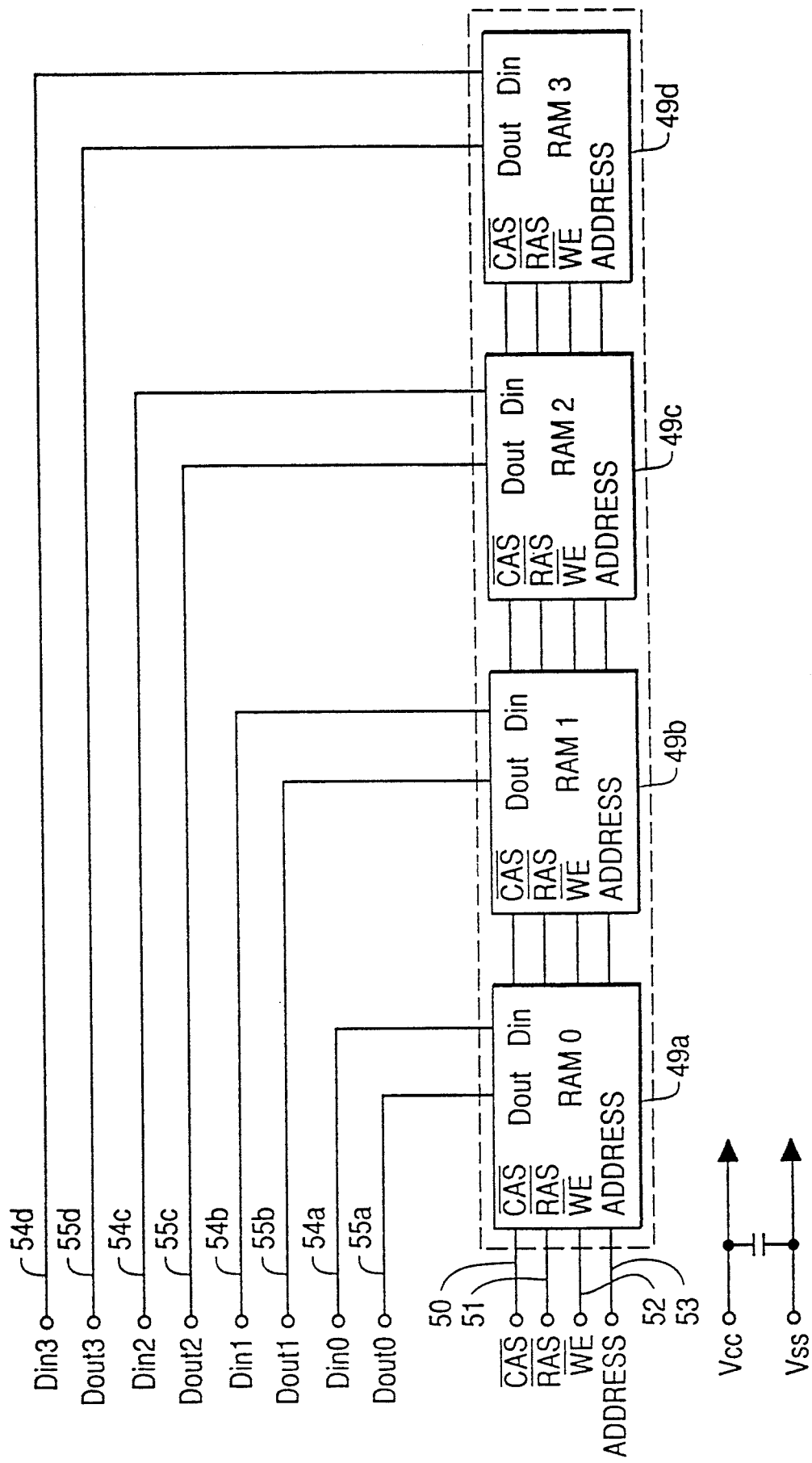
FIG. 17 is a block diagram showing the overall circuit of another example of the semiconductor module of the present invention.
Figure 18:
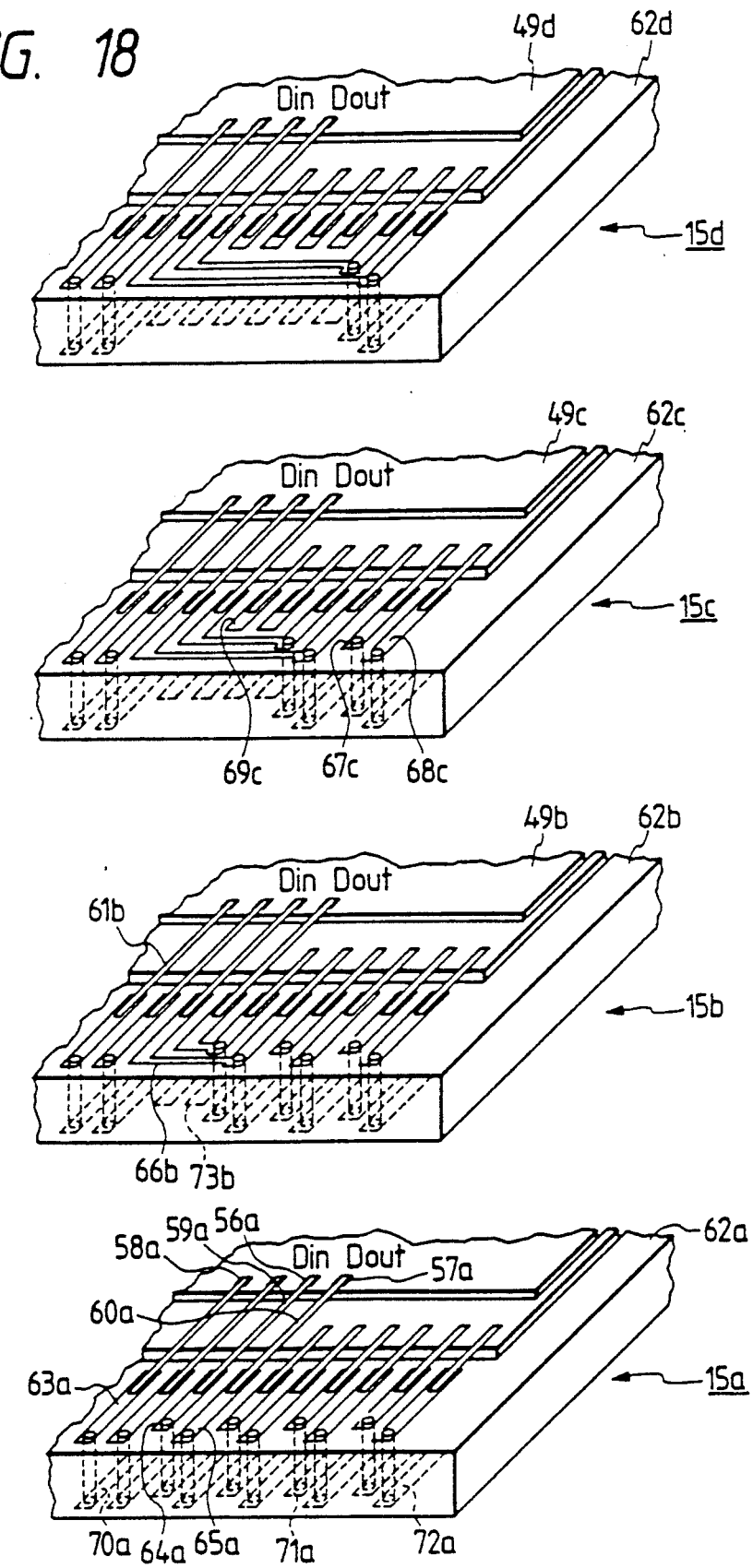
FIG. 18 is a perspective view showing an essential portion of the semiconductor device having stacked connectors according to FIG. 17.

The memory module of FIGS. 17 and 18 has the same contour as that of FIGS. 11 to 14, and the pin arrangement is exemplified in Table 2. This memory module 25 is the DRAM constructing the input/output of 4 mega bits×1 and has a capacity of 4 mega bits as a whole. A $\overline{RAS}$ terminal 51, a $\overline{CAS}$ terminal 50, a $\overline{WE}$ (write enable) terminal 52, an address terminal 53 and power source terminals Vcc and Vss are identical to those of the aforementioned application 1 and will be omitted.

In FIG. 17, the individual chips (RAM0 to RAM3) have a capacity of 1 mega bits, and the $\overline{CAS}$ terminal 50, the $\overline{RAS}$ terminal 51, the $\overline{WE}$ terminal 52, the address terminal 53 and the power source terminals Vcc and Vss are commonly used.

First of all, data are written in the individual chips (RAM0 to RAM3) independently of one another by feeding signals to the address terminal 53, the $\overline{RAS}$ terminal 51, the $\overline{CAS}$ terminal 50 and the $\overline{WE}$ terminal 52 and simultaneously feeding the data signal to only such one of individual data input terminals 54a to 54d as is used for writing the data. Only reading one of data output terminals 55a to 55d is activated to read out data only from predetermined chips independently of one another.

In FIG. 18, data input/output terminal pads 56a to 56d and 57a to 57d on the surfaces of the semiconductor chips 49a to 49d correspond to the $\overline{RAS}$ terminal pads 42a to 42d on the surfaces of the semiconductor chips 1a to 1d of FIG. 16 of the aforementioned application 1. On the other hand, data input/output lead lines 59a to 59d and 60a to 60d correspond to the $\overline{RAS}$ terminal lead lines 44a to 44d: common terminal pads 58a to 58d correspond to the common terminal pads 43a to 43d; and common lead lines 61a to 61b correspond to the common lead lines 45a to 45d. Furthermore, connectors 62a to 61d are formed on their surfaces with patterns for achieving objects similar to those of the aforementioned application 1. Specifically, the patterns include common terminal patterns 63a to 63d, data input/output patterns 64a to 64d and 65a to 65d, connection patterns 66b to 66d, data input/output especial patterns 67a to 67d and 68a to 68d, and surface dummy patterns 69c and 69d. The backs are also formed with patterns, namely, back common terminal patterns 70a to 70d, back input/output especial patterns 71a to 71d and 72a to 72d, and back connection patterns 73b to 73d.

The present application 2 has the signal feed paths similar to those of the application 1, as described above. In the application 1, however, the $\overline{RAS}$ terminals 31a to 31d are selected to select the chips for the data input/output. In the present application 2, on the contrary, signals for writing data in individual chips 49a to 49d (i.e., RAM0 to RAM3) are can be fed to read out the designated data from the individual chips.

By using the connectors of the application 2 of the present embodiment, it is possible to provide a package structure which has a memory capacity of four times for the same mounting area as that of the package of the prior art. Specifically, the connectors of the application 2 can feed signals to the individual four semiconductor chips and read out data from the individual chips independently of one another. Moreover, the semiconductor module of the present invention can be provided merely by changing only the patterns relating to the data input/output of the connectors but without any change in the patterns of the TABs.

Next, the modifications of the semiconductor module package used in the aforementioned applications 1 and 2 will be described in the following with reference to FIGS. 19 to 23. The same functions are designated by the same reference characters.

Figure 19:
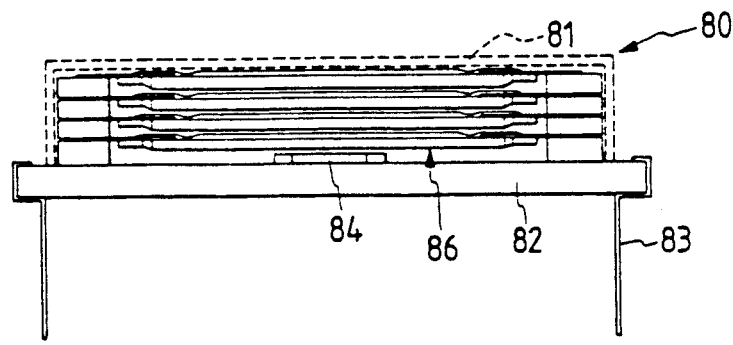
FIGS. 19, 21, 22 and 23(a) to 23(c) are side elevations showing a variety of modifications of the package in case the semiconductor module of the present invention is used.
Figure 20:
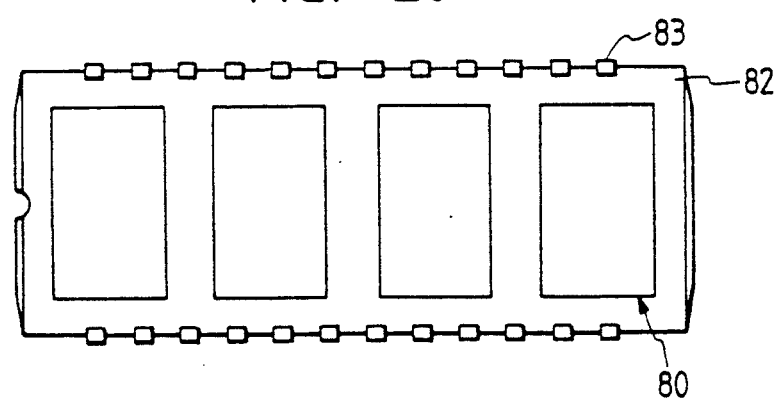
FIG. 20 is a top plan view of FIG. 19.
Figure 21:
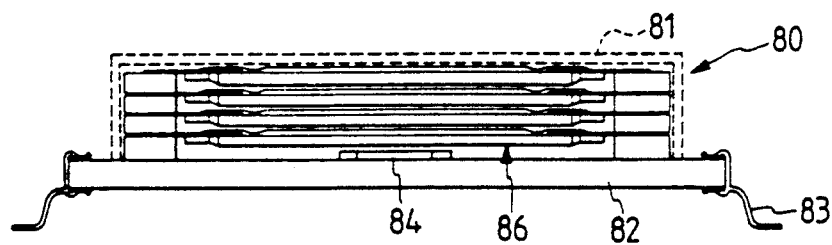
Figure 22:
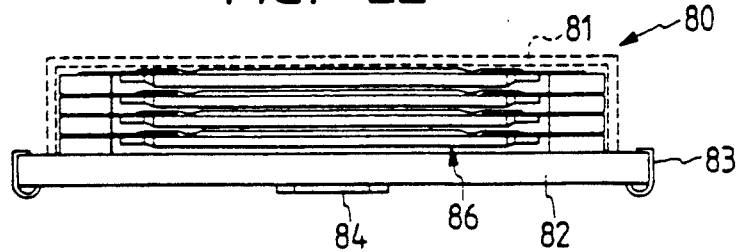
Figure 23A:
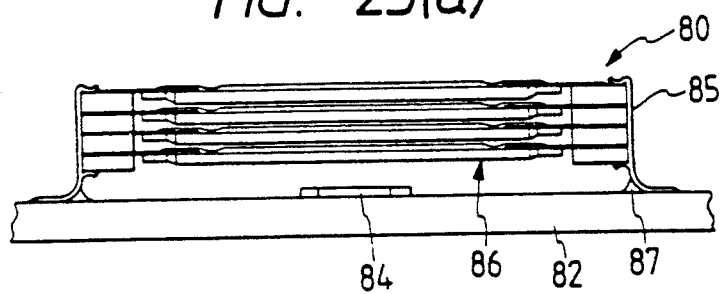
Figure 23B:
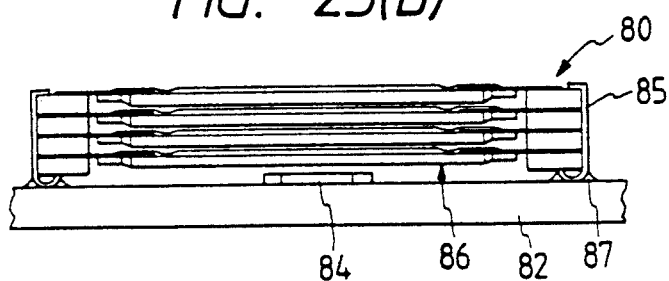

FIG. 19 is a section showing the package modification 1;

FIG. 20 is a top plan view showing the package modification 1;

FIG. 21 is a section showing the package modification 2;

FIG. 22 is a section showing the package modification 3;

FIG. 23(a) is a section showing the package modification 4;

FIG. 23(b) is a section showing the package modification 5; and

Figure 23C:
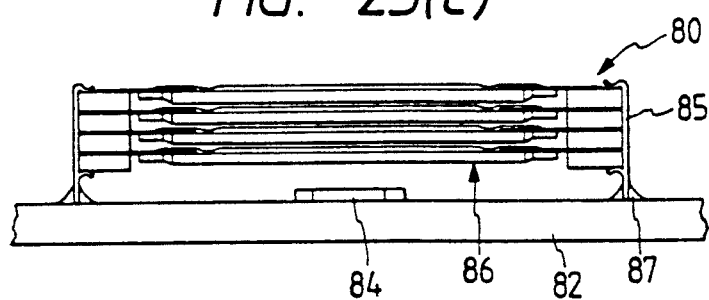

FIG. 23(c) is a section showing the package modification 6.

First of all, as shown in FIGS. 19 to 22, a multi-chip semiconductor device 86 is mounted on a substrate 82 having the same functions as those of the substrate 20 of FIG. 11. On the upper or Lower face of the substrate 82, on the other hand, there is mounted a chip capacitor 84 which is overlain by the multi-chip semiconductor device 86. Moreover, this multi-chip semiconductor device 86 is covered with a cover member 81. Lead-out pins 83 for leading out signals are attached to the substrate 82, thus constructing a semiconductor module 80 having the same functions as those of the semiconductor module 25 shown in FIG. 11.

In FIG. 19, the lead-out pins 83 have the same shape as that of the so-called "DIP" (Dual In-line Package).

FIG. 20 is a top plan view of FIG. 19, and four semiconductor modules 80, for example, are mounted on the substrate 82. However, the number of the semiconductor modules 80 to be mounted should not be limited to four but may be one or more. Moreover, FIGS. 21 and 22 are section views similar to FIG. 19.

FIG. 21 shows the gull-wing type lead-out shape of the facial mounting type package, and FIG. 22 shows the lead-out shape of the J-bend type package.

Next, FIGS. 23(a) to 23(c) show modifications of the section A—A' of the semiconductor module of FIG. 11. The multi-chip semiconductor device 86 is mounted on the substrate 82 through substrate-attached leads 85 and an adhesive 87 such as solder.

The substrate-attached leads 85 of FIG. 23(a) are those of the so-called gull-wing type package; the substrate-attached leads 85 of FIG. 23(b) are those of the J-bend type package; and the substrate-attached leads 85 of FIG. 23(c) are those of the bud type package. Moreover, the chip capacitor 84 is disposed on the upper or lower face of the substrate 82 and below the multi-chip semiconductor device 86.

By using the substrate-attached leads 85 having an elasticity at the connecting portions between the multi-chip semiconductor device 86 and the substrate 82, as shown in FIGS. 23(a) to 23(c), the thermal stress, which is generated due to the difference between the coefficients of thermal expansion of the multi-chip semiconductor device 86 and the substrate 82, can be damped to improve the connection reliability effectively.

Next, another application 3 of the Embodiment I will be described in the following with reference to FIGS. 24 to 27.

First of all, as shown in FIG. 24, a multi-chip semiconductor device 92 is mounted on a printed wiring substrate 91 which is formed with a copper wiring pattern 98. The printed wiring substrate 91 is provided with substrate positioning holes 97 and connector terminals 94. Moreover, eight multi-chip semiconductor devices 92 are mounted on the printed wiring substrate 91 to construct a semiconductor module 95 according to the application 3 of the present Embodiment I.

The printed wiring substrate 91 is made of a resin substrate, for example, and can be constructed in various manners by combining its bases and binders. The base may be exemplified by glass fibers, paper or synthetic fibers, and the binder may be exemplified by epoxy resin, phenol resin or polyimide resin. A preferred substrate is an epoxy resin substrate based on the glass fibers.

The formation of the wiring pattern 98 on the printed wiring substrate 91 is accomplished by the ordinary etching or photo resist technique.

The multi-chip semiconductor device 92 in the application 3 is identical to that used in the foregoing applications 1 and 2 and is similar thereto in the method of stacking semiconductor devices 90a to 90d and the structure of connectors 93a to 93d.

Figure 27:
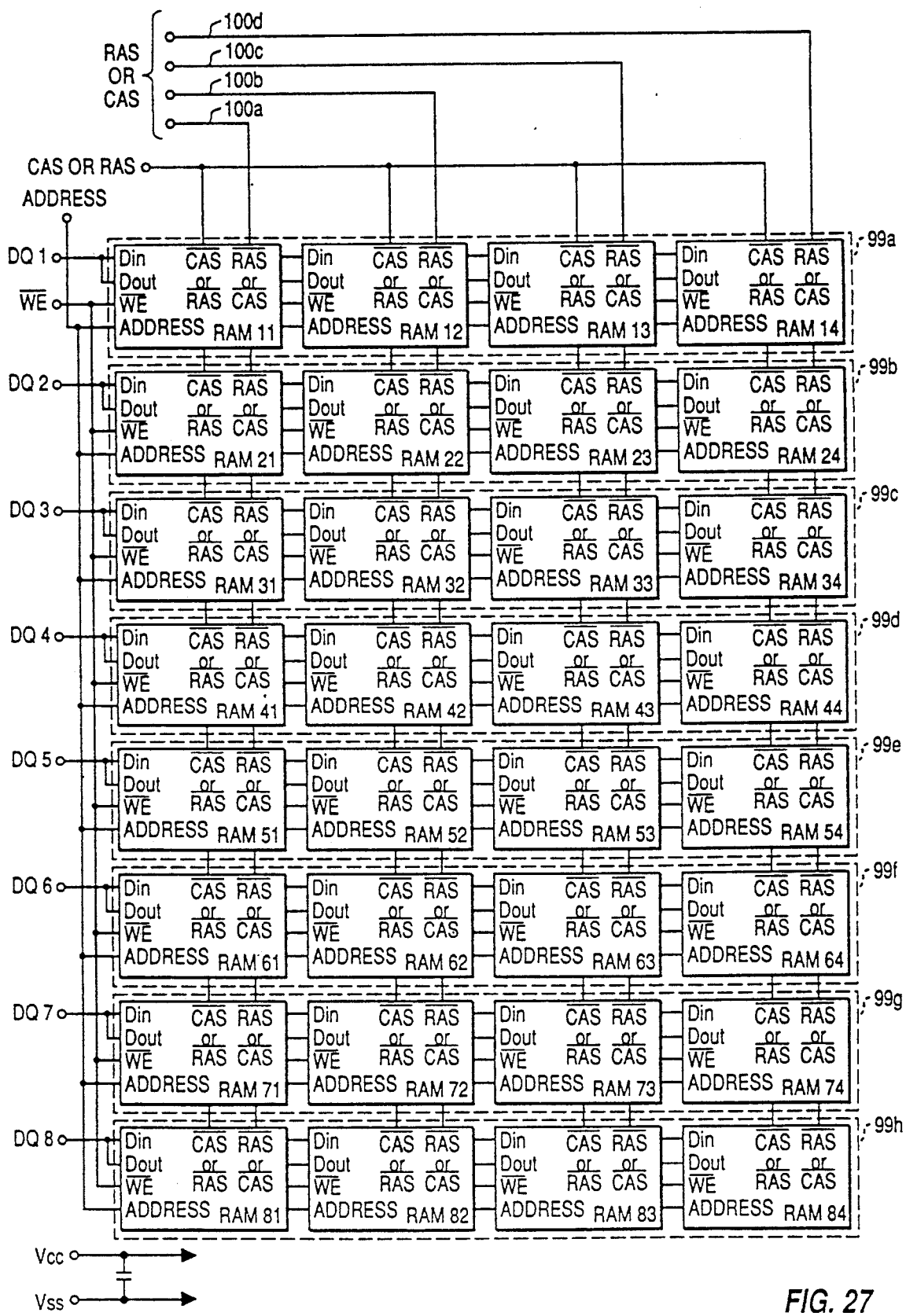
FIG. 27 is a block diagram showing the overall circuit of the semiconductor module of FIG. 24.

In FIG. 27, reference numerals 99a to 99h designate circuit blocks of the individual multi-chip semiconductor device shown in FIG. 24 and a semiconductor module combining eight DRAMs (Dynamic Random Access Memories) of FIG. 15. This semiconductor module is used in a microcomputer, for example. In FIG. 27, the $\overline{WE}$ ( Write Enable ) terminal, the address terminals , the data input/output terminals (DQ1 to DQ8), and the power source terminals (Vcc and Vss) are commonly shared. In case the $\overline{CAS}$ terminal is used as a common terminal, the $\overline{RAS}$ terminal is used for selecting the chips (e.g., RAMs 11 to RAMs 14). In case the $\overline{RAS}$ terminal is used as a common terminal, on the contrary, the $\overline{CAS}$ terminal is used for selecting the chips.

Here will be described the case, in which the $\overline{CAS}$ terminal is used for selecting the chips.

In the semiconductor module of FIG. 27, more specifically, when a signal is fed to a $\overline{RAS}$ terminal 100a simultaneously as signals are fed to the address terminals, the $\overline{WE}$ (Write Enable) terminals, the data input/output terminals (DQ1 to DQ8), the $\overline{RAS}$ terminals, the signal is fed to the chips sharing the signal of the $\overline{RAS}$ terminal 100a, i.e., RAM 11, RAM21, RAM31, RAM41, RAM51, RAM61, RAM71 and RAM81. The data input (Din) is accomplished in case a Low signal is fed to the $\overline{WE}$ terminal, and the data output (Dour) is accomplished in case a High signal is fed.

Moreover, the present application 3 is exemplified by the case in which the multi-chip semiconductor device 92 is mounted on one side of the printed wiring substrate 91, but the multi-chip semiconductor devices 92 may be mounted on the two sides of the substrate. In this case, too, the formation is made like the case of the one-side mounting. In the case of the two-side mounting, moreover, it is possible to provide a highly integrated and dense semiconductor module.

Next, another application 4 of the Embodiment I will be described with reference to FIGS. 28 to 33.

Figure 33:
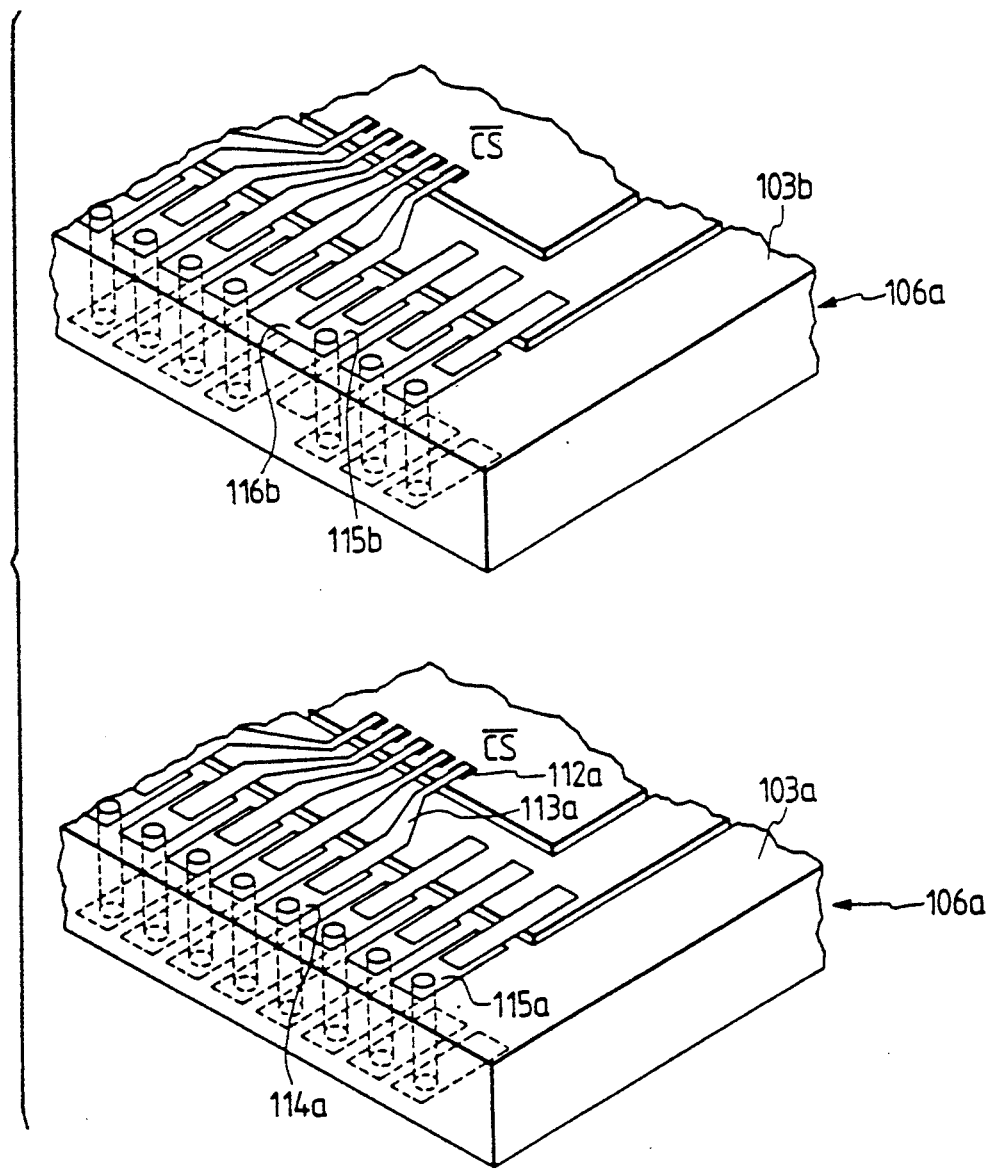
FIG. 33 is a perspective view showing an essential portion of the semiconductor device having stacked connectors according to FIG. 28.

Here, FIG. 33 is a perspective view showing the detail of each $\overline{CS}$ (Chip Select) terminal of the present application 4.

First of all, in FIGS. 28 to 30, there is shown a semiconductor module 105 in which a multi-chip semiconductor device 102 identical to the multi-chip semiconductor device of the present Embodiment I shown in FIGS. 11 and 12 and a decoder IC 104 are mounted on a stacked ceramic substrate 101. The multi-chip semiconductor device 102 is constructed by stacking four semiconductor devices 106a to 106d in which an integrated circuit chip of SRAM (Static Random Access Memory) MOS type or bipolar MOB type of 1 mega bits is mounted.

In FIG. 31: reference letters A0 to A18 designate address input pins; letters I/O0 to I/O7 data input/output pins; letters Vss and Vcc power source terminal pins; and letters $\overline{WE}$, $\overline{OE}$ and $\overline{CS}$ a series of control pins, of which: the $\overline{WE}$ designate a write enable pin; the $\overline{OE}$ an output enable pin; and the $\overline{CS}$ a chip select pin.

Figure 32:
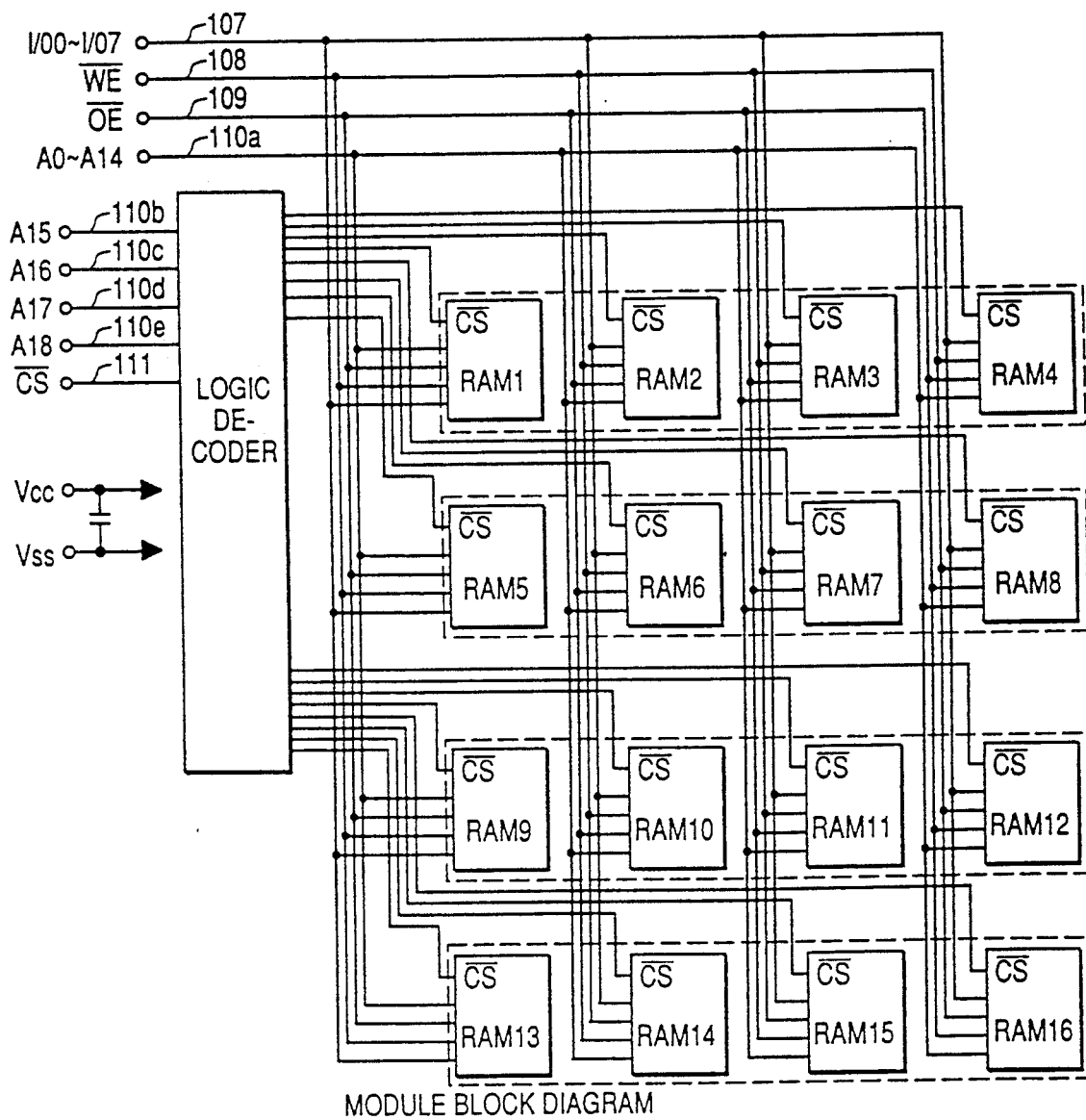
FIG. 32 is a block diagram showing the overall circuit of the semiconductor module of FIG. 28.

In FIG. 32, the letters I/O0 to I/O7, $\overline{WE}$, $\overline{OE}$, A0 to A18 and $\overline{CS}$ are similar to the aforementioned ones and will be omitted. Moreover, letters RAM1 to RAM16 designate integrated circuit chips of SRAM (Static Random Access Memories) of 1 mega bits.

In FIG. 32, In FIG. 32, only one chip can be selected to write the data by feeding a write signal to address terminals 110a (A0 to A14), a $\overline{WE}$ terminal 108 and data input/output terminals 107 (I/O0 to I/O7) and by feeding signals to chip selecting address terminals 110b to 110e (A15 to A18) and $\overline{CS}$ terminal leading to the chips (RAM1 to RAM16).

For reading the data, the data are outputted to the data input/output terminal 107 by feeding a read allowing signal to the data $\overline{OE}$ (Out Enable) terminal with the remaining connections being held in the same state as that for the data writing.

FIG. 33 shows the detail of the $\overline{CS}$ (Chip Select) terminals of the semiconductor devices 106a to 106d at the first and second steps of the semiconductor module 105 of the application 4.

In FIG. 33: reference numeral 112a designates the $\overline{CS}$ (Chip Select) terminal pad at the first (or lower-most) step; numeral 113a a chip select lead line of the same; numeral 114a a chip select terminal pattern; numeral 115a a chip select especial pattern; and numeral 116b a connection pattern for connecting the chip select terminal pattern 114a and the chip select especial pattern 115a.

The connectors 103a and 103b are formed on their surfaces and backs with the same patterns as those of the foregoing application 1 of FIG. 16 to constitute the multi-chip semiconductor device similar to that of the application 1 except that the terminals on the chip to be selected is not the $\overline{RAS}$ terminals but the $\overline{CS}$ terminals 112a to 112d. Moreover, the signal paths to the semiconductor device 106a at the first step and to the semiconductor devices 106b to 106d at the second, third and fourth steps are similar to those of the application 1 of FIG. 16, and their detailed descriptions will be omitted.

In the application 4 of the present Embodiment I, more semiconductor chips can be mounted for the same mounting area as that of the package of the prior art. In other words, the mounting density of the semiconductor device can be enhanced. Since, moreover, the TAB (Tape Automated Bonding) chips are stacked, the resultant package can be thinned.

Furthermore, a semiconductor module having a capacity of several times can be provided by changing the inside layout of the chip, the leads of the film carrier and so on but the patterns of the individual connectors partially.

Next, a modification of the lead shape of the aforementioned multi-chip semiconductor device is shown in FIGS. 34 to 37.

Figure 34A:
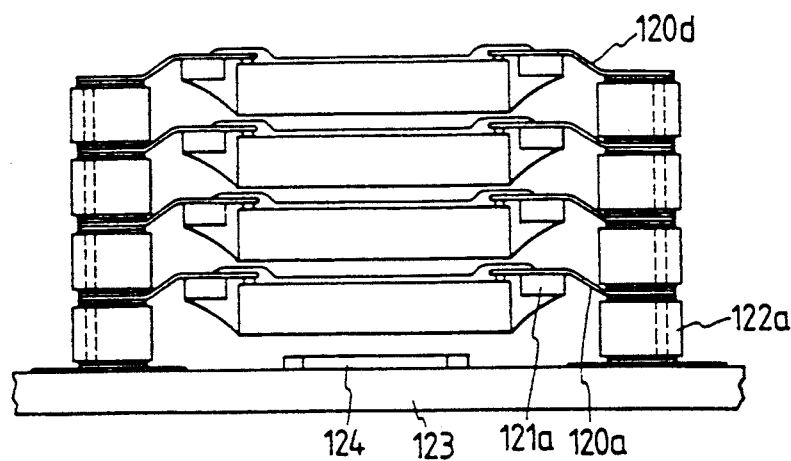
Figure 34B:
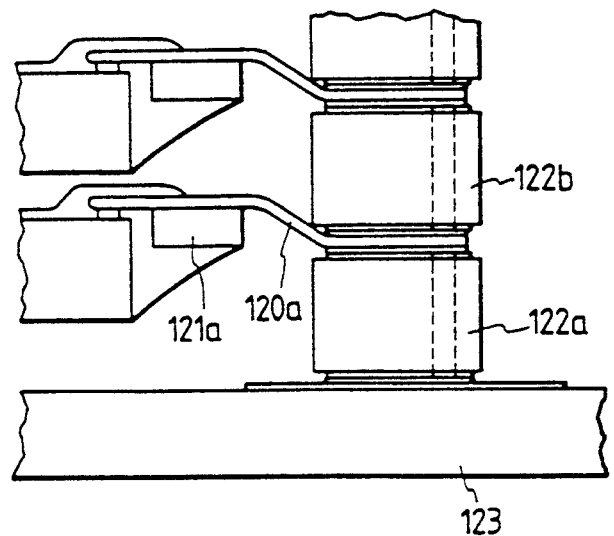
FIG. 34(b) is an enlarged side elevation showing the connector connecting portions of FIG. 34(a)

First of all, as shown in FIG. 34(a), outer leads 120a to 120d are bent upwardly of a substrate 123 from their adhesion ending portions to connectors 122a to 122d to their connection starting portions to film carrier tapes 121a to 121d. FIG. 34(b) is an enlarged view of the connecting portions of the first and second step connectors 122a and 122b. The portions of the outer leads 120a to 120d other than their bent portions such as the connector connecting portions or chips are similar to those shown in FIG. 14, and the foregoing descriptions will form part of the description of FIG. 34.

In the present lead modification 1, the region for accommodating a chip capacitor 124 can be sufficiently retained by bending the leads upward without any substantial change in the thickness of the package. Moreover, the bent outer lead portions 120a to 120d can damp the thermal stress which is generated by the difference between the coefficients of thermal expansion of the connector 122a and the TAB 129a.

Figure 35:
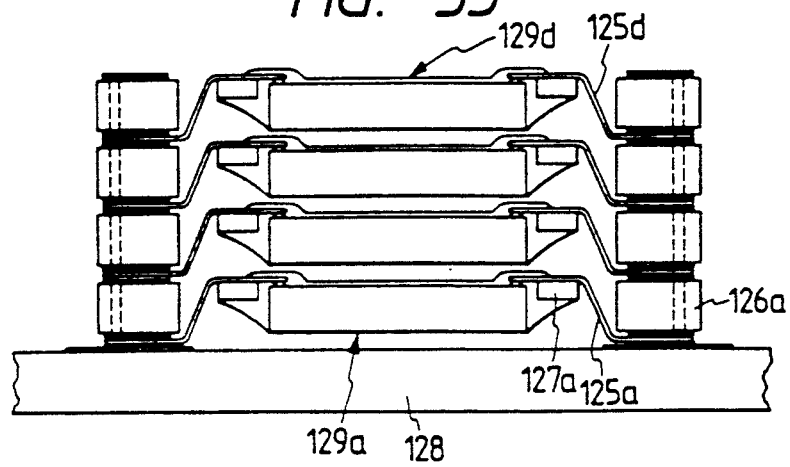

Next, as shown in FIG. 35, outer leads 125a to 125d are bent upwardly of a substrate 128 between their adhesion ending portions to connectors 126a to 126d and their connection end portions to film carrier tapes 127a to 127d and from the backs to surfaces of the connectors 126a to 126d. Moreover, the connecting portions are similar to those of FIG. 34(b), which will form part of the description of the present modification 2.

Since, in the present lead modification 2, the TABs 129a to 129d are as thick as the connectors 126a to 126d, the package of the multi-chip semiconductor device can be further thinned, and the thermal stress can be highly damped by the lead deformations.

Figure 36:
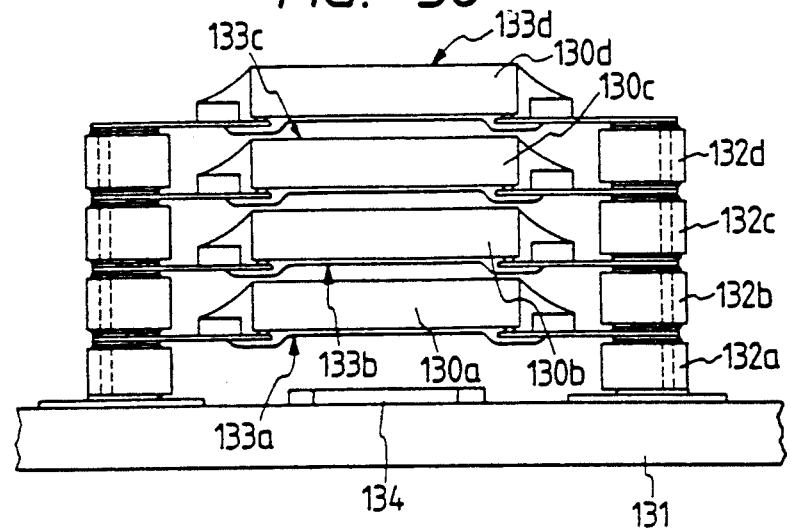

In FIG. 36, on the other hand, TABs 133a to 133d are mounted on connectors 132a to 132d in the opposite directions of FIG. 12. Specifically, the mounting is accomplished such that the circuits of semiconductor chips 130a to 130d and their bump forming faces are directed toward a substrate 131 while leaving the connectors 132a to 132d as they are.

In the present lead modification 3, it is possible to sufficiently retain the region for a chip capacitor 134 to be mounted on the substrate 131.

Figure 37A:
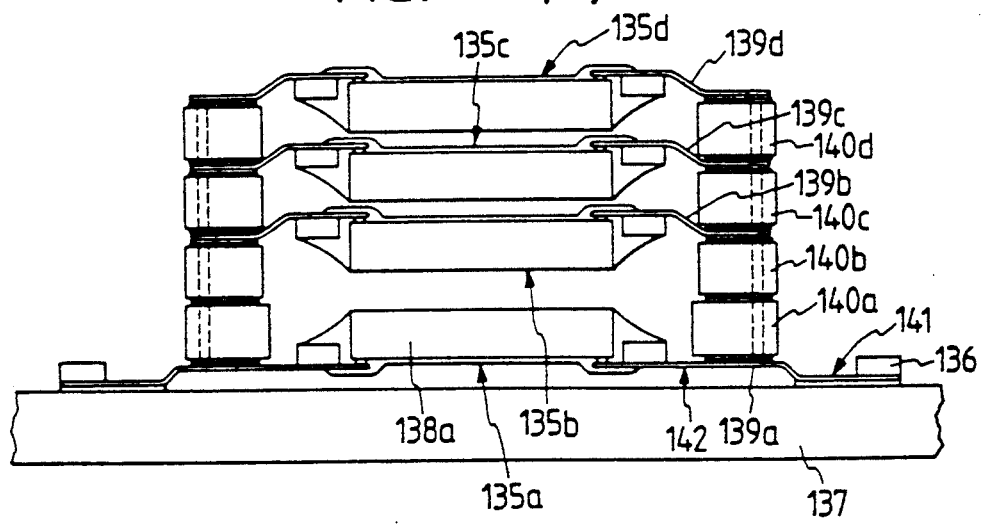
Figure 37B:
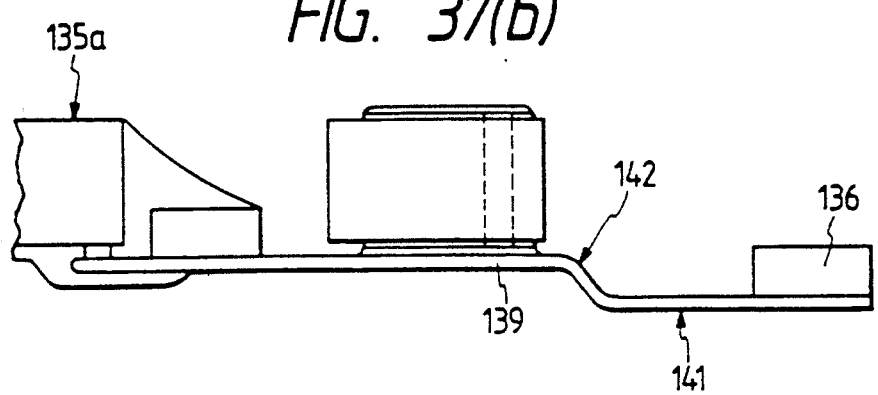
FIG. 37(b) is an enlarged side elevation showing a portion of the lowermost step of FIG. 37(a)

FIG. 37 shows an example in which only the lowermost lead is deformed. The lowermost film carrier 135a is mounted such that the circuit of a semiconductor chip 138a and their bump forming face are directed toward a substrate. Moreover, the film carrier 135a has its outer lead 139a extended farther than the outer frames of connectors 140a to 140d until it is connected at its extended portion with the substrate 137. A retaining tape 136 is formed on that side of the extended outer lead 141, which is out of contact with the substrate 137. The retaining tape 136 connects a lead pattern 142 with the semiconductor chip 138a to prevent any dispersion of the lead when the outer lead 139a is attached to the connector 140a. On the other hand, the holding tape is made of the same material as that of the film carrier tape, such as a polyimide resin or a glass epoxy resin.

In the present modification of the lowermost lead, the connecting portion of the substrate 137 and the extended outer lead 141 is located outside of the connector so that the connection is facilitated. Since, moreover, the connecting portion is visible, the propriety of the connection can be easily checked. Thanks to the deformation of the extended outer lead 141, the thermal stress at the connecting portion due to the difference between the thermal expansions of the substrate 141 and the TAB so that the highly dense mounted package can be obtained while preventing the lead dispersion.

Next, a modification of the lowermost connector will be described with reference to FIGS. 38 to 40.

Figure 38:
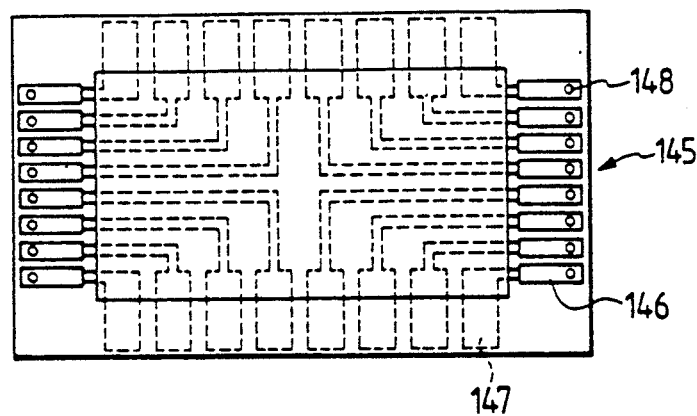
FIG. 38 is a top plan view showing one example of the lowermost connector.

First of all, as shown in FIG. 38, a connector 145 has its surface formed with a surface pattern 146 of Cu and its back formed with a back pattern 147 which is connected through the through holes 148 with the surface pattern 146 and which is arrayed from the shorter to longer sides of the connector 145.

Figure 39:
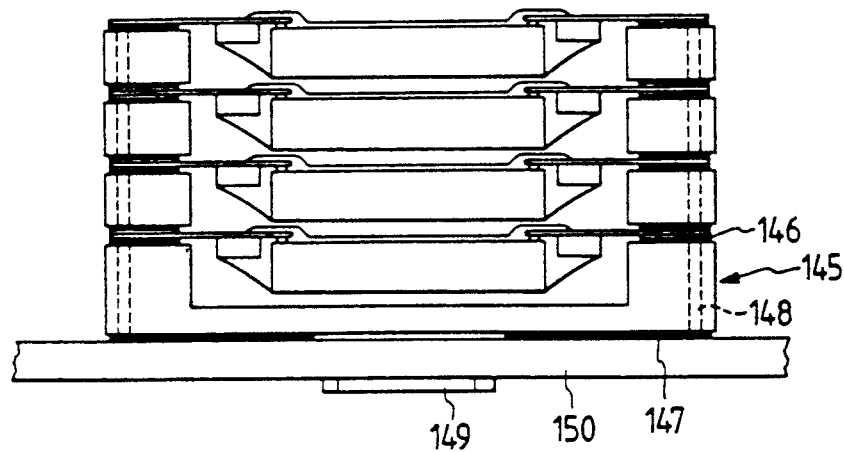
FIG. 39 is a side elevation showing the semiconductor device with the connectors using the connector of FIG. 38.

As shown in FIG. 39, the connector 145 is soldered through the back pattern 147 to a substrate 150. In case the connector 145 of this modification 1 is used, on the other hand, a chip capacitor 149 is mounted on the back of the substrate 150.

The connection pattern pitch to the substrate can be freely set by forming the back pattern 147, as shown in FIG. 38, and attaching it to the connector back. Specifically, in case the back pattern to be attached to the substrate is formed on the back at the same pitch as that of the surface pattern 146 of the connector 145, it is shorted, when soldered, because of the short pitch. Therefore, the patterns can be easily soldered by extracting the pattern of the back from the shorter to longer sides of the connector 145.

Figure 40:
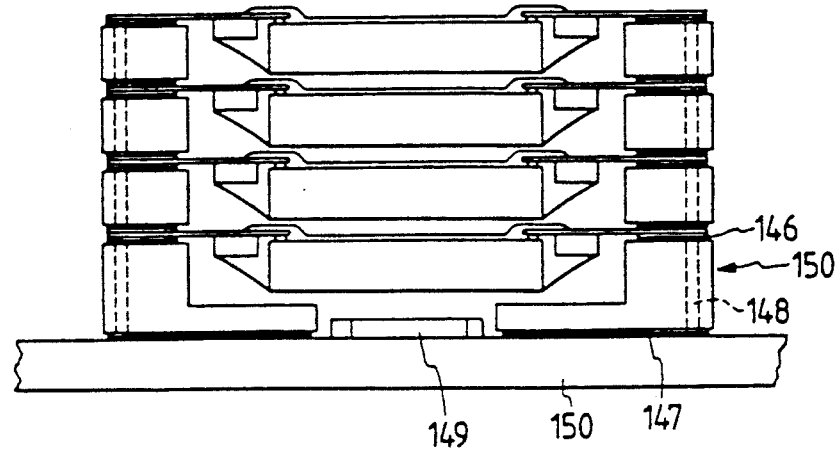
FIG. 40 is a side elevation showing the semiconductor device with connectors using another example of the lowermost connector.

In FIG. 40, the bottom of the connector 150 is removed. Then, the chip capacitor 149 can be mounted in the emptied space, and the pattern pitch of the connector back can be more freely set than at the shorter side.

Next, an example for providing a multi-chip semiconductor device of the present Embodiment by deforming the TAB lead pattern will be described with reference to FIGS. 41 and 42, and an example for providing a multi-chip semiconductor device of the present Embodiment by deforming the chip side pattern will be described with reference to FIG. 43.

Figure 41:
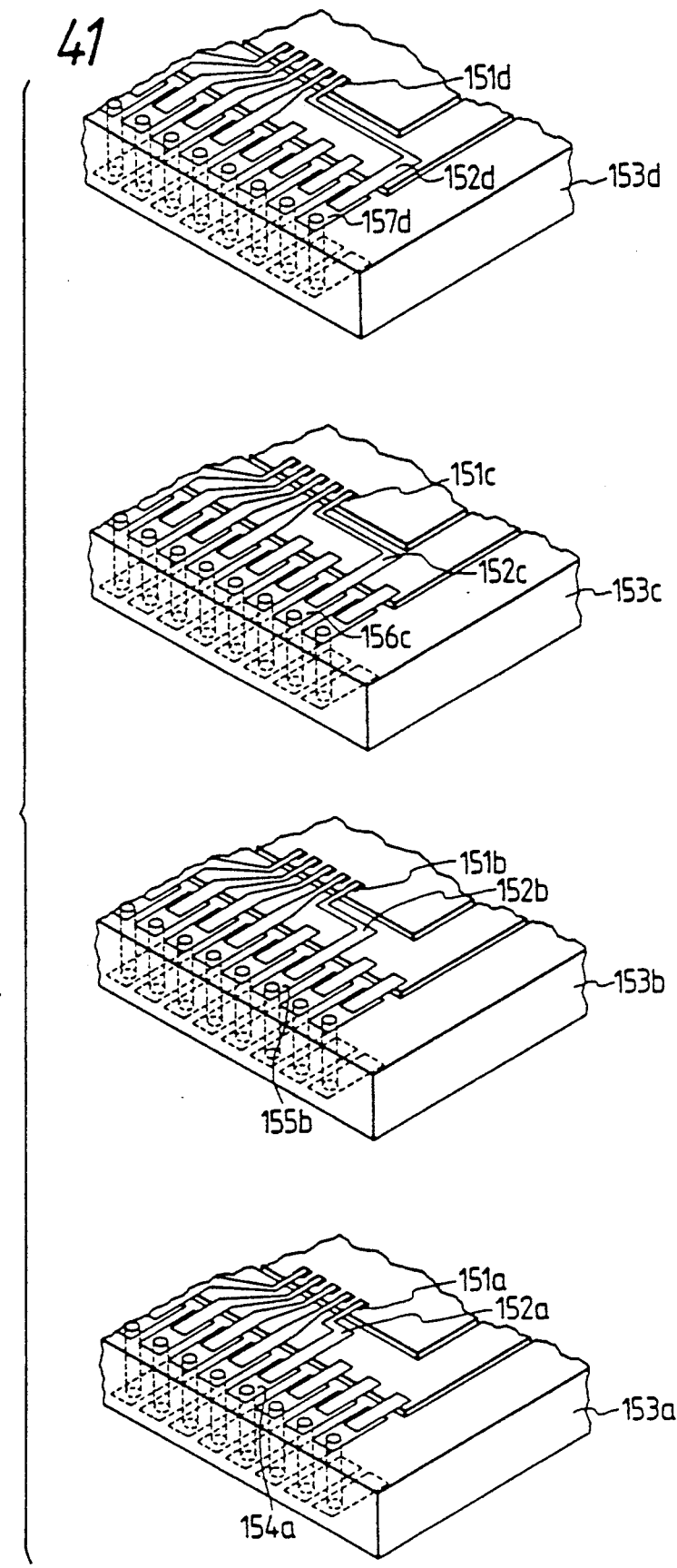
FIGS. 41 to 43 are perspective views showing essential portions of other examples of the semiconductor with stacked connectors.

First of all, in case a MOS type circuit element of DRAM (Dynamic Random Access Memory) is used, as shown in FIG. 41, the terminals for selecting the chips, i.e., $\overline{\text{RAS}}$ terminal leads 152a to 152d to be connected with $\overline{\text{RAS}}$ terminals 151a to 151d are connected with a $\overline{\text{RAS}}$ terminal pattern 154a at a first-step connector 153a, with a first $\overline{\text{RAS}}$ especial pattern 155b at a second-step connector 153b, and with second and third $\overline{\text{RAS}}$ especial patterns 156c and 157d likewise at third and fourth steps, respectively. On the other hand, connectors 153a to 153d can be used at the first to fourth steps without any alteration.

According to the present modification I, only a specified chip of the stacked semiconductor chips can be selectively operated merely by changing the chip selecting lead of the TAB leads while leaving the in-chip layout, the leads of the signal feed paths and the connectors unchanged. Thus, it is possible to provide a memory module which has a memory capacity of four times for the same mounting area.

Figure 42:
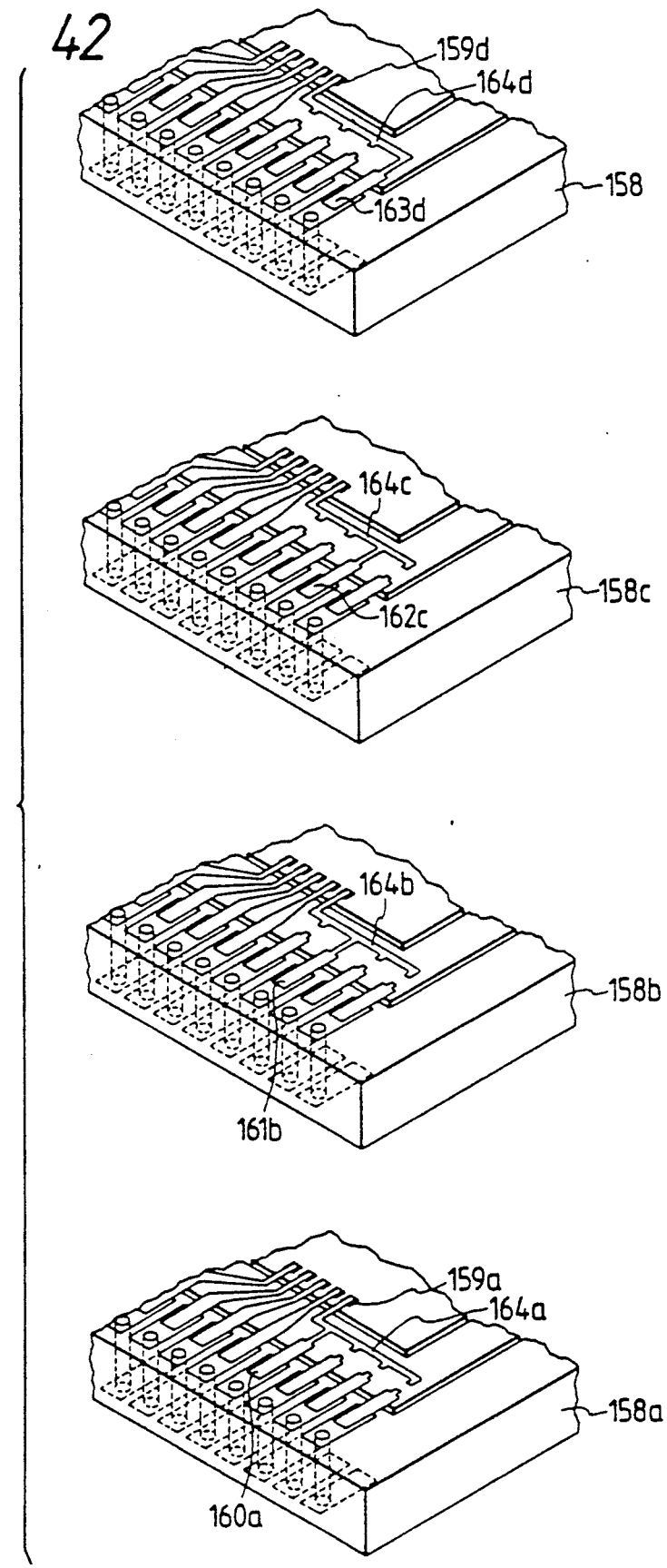

Next, as shown in FIG. 42, here will be exemplified the in which the same circuit elements as those of the modification I. $\overline{\text{RAS}}$ terminal pads 159a to 159d are connected in advance with a $\overline{\text{RAS}}$ especial lead line 164, first $\overline{\text{RAS}}$ especial leads 160a to 160d, second $\overline{\text{RAS}}$ especial leads 161a to 161d, third $\overline{\text{RAS}}$ especial leads 162a to 162d and fourth $\overline{\text{RAS}}$ especial leads 163a to 163d. In order that signals may be fed to first- to fourth-step elements individually, only the first $\overline{\text{RAS}}$ especial lead line 160a is first connected whereas the remaining second fourth $\overline{\text{RAS}}$ especial lead lines 161a, 162a and 163a are cut by means of a laser beam. At the second, third and fourth steps, too, only the second $\overline{\text{RAS}}$ especial lead lines 161b, third $\overline{\text{RAS}}$ especial lead line 162c and fourth $\overline{\text{RAS}}$ especial lead line 163d are connected whereas the remaining especial lead lines are cut.

In other words, the modification II can achieve the object of the present Embodiment I. Thus, the semiconductor module of the present invention can be obtained by preparing identical ones of the in-chip layout and all the lead lines and connectors to be connected with the semiconductor chips and by cutting the remaining lead lines by means of the laser while the necessary lead lines being connected in accordance with the number of steps to be stacked. In the modification II, on the other hand, the $\overline{\text{RAS}}$ especial lead lines 164a to 164d are formed in advance without being connected with the first to fourth $\overline{\text{RAS}}$ especial lead lines 160 to 163, and the connections are accomplished, if necessary, by means of the wire bonding when the individual steps are to be formed, such that the first-step connector is connected with the $\overline{\text{RAS}}$ especial lead line 164a and the first $\overline{\text{RAS}}$ especial lead line 160a whereas the second-step connector is connected with the $\overline{\text{RAS}}$ especial lead line 164b and the second $\overline{\text{RAS}}$ especial lead line 161b.

In this case, too, four identical sets of in-chip layouts, all the lead lines to be connected with the TAB chips, and connectors are prepared so that only the necessary lead lines according to the number of steps to be stacked can be connected.

Figure 43:
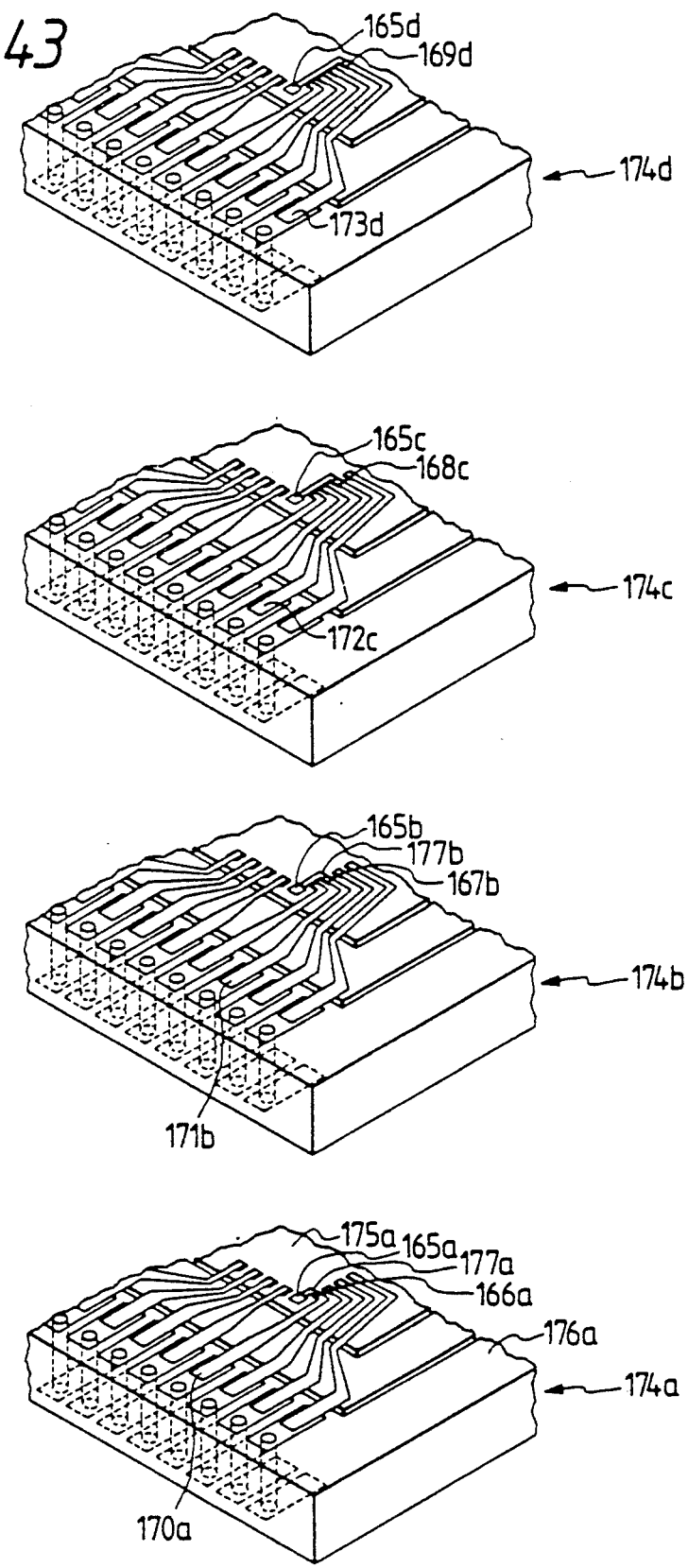

Next, in case MOS type circuit elements of DRAMs are used, as shown in FIG. 43: reference numerals 165a to 165d designate $\overline{\text{RAS}}$ terminal pads; numerals 166a to 166d first $\overline{\text{RAS}}$ terminal pads; and numerals 167a to 167d, 168a to 168d and 169a to 169d second to fourth $\overline{\text{RAS}}$ terminal pads, respectively. Moreover, reference numerals 170a to 170d, 171a to 171d, 172a to 172d and 173a to 173d designate first to fourth $\overline{\text{RAS}}$ especial lead lines, respectively.

In the present modification III, the description will be made on a semiconductor device 174a having a connector at the first step.

A semiconductor chip 175a is formed in advance with a circuit pattern and pads and further with a connector 176a and lead lines (such as common lead lines and the aforementioned $\overline{\text{RAS}}$ especial lead lines). Moreover, signals are fed by way of the $\overline{\text{RAS}}$ terminal pad 165a, the first $\overline{\text{RAS}}$ terminal pad 166a and the first $\overline{\text{RAS}}$ especial lead line. The $\overline{\text{RAS}}$ terminal pad 165a and the first $\overline{\text{RAS}}$ terminal pad 166a are wired by the master slice method, in which an insulating film (of $SiO_2$ or the like) for insulating the circuit elements and the wiring pattern is formed on the semiconductor chip formed with the circuit elements, electrode patterns and wiring patterns and is then covered with a wiring line 177a of aluminum and in which the $\overline{\text{RAS}}$ terminal pad 165a and the first $\overline{\text{RAS}}$ terminal pad 166a to be connected with the aluminum wiring pattern are then formed.

Specifically, the bump electrode (i.e., the first $\overline{\text{RAS}}$ terminal pad 166a) is formed at the leading end of the lead line 170a to bond the aforementioned first $\overline{\text{RAS}}$ especial lead line 170a.

Semiconductor devices 174b to 174d having connectors at the second to fourth steps are likewise prepared by forming aluminum wiring lines to the leading ends of their individual especial lead lines from the $\overline{\text{RAS}}$ terminal pads 165b to 165d, by forming bump electrodes at the leading ends and by bonding the especial lead lines.

In the modification III, the object of the present Embodiment I can be achieved by forming one wiring line on the chip so as to construct the semiconductor device at each step without any change in the circuit elements, electrodes and wiring layout in the chip, the lead lines and the connectors. Since, moreover, the first to fourth $\overline{\text{RAS}}$ terminal pads are formed later on the chip, the chip size remains unchanged from that of the prior art because there is no need for changing the wiring in the chip.

In FIGS. 41 to 43, the description has been made in connection with the MOS type circuit elements composed of the DRAM, to which the present invention should not be limited but may be exemplified by the MOS type or bipolar MOS type integrated circuit chips of the SRAM (Static Random Access Memory).

Next, a modification of the connector will be described.

Figure 44:
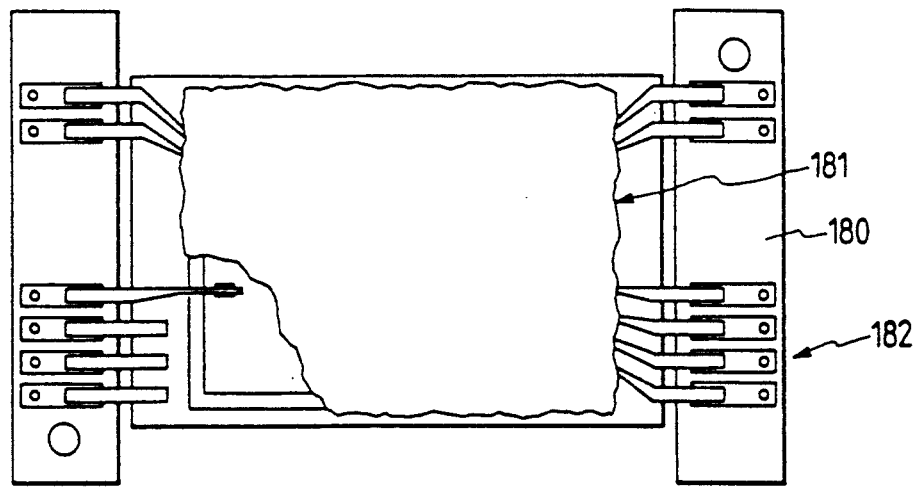
FIG. 44 is a top plan view showing one example of the connector.

FIG. 44 is a top plan view showing the connector modification.

In FIG. 44, a resinated TAB 181 is mounted on two side connectors 180 to construct a semiconductor device 182 having the connectors.

The two side connectors 180 are made of glass epoxy or ceramics.

By using the two side connectors 180 shown in FIG. 44, the shorter side size of the semiconductor device can be reduced. On the other hand, the connector itself is easier to work than the connector formed in the frame shape. If, moreover, the connector is made of ceramics, it is easier to work than that made of glass epoxy and has better radiation.

Since, moreover, there arises no thermal stress due to the difference between the thermal expansions of the connector and the TAB in the direction of the longer side, it is possible to improve the connection reliability of the connector and the TAB leads drastically.

Embodiment II

The Embodiment II of the present invention will be described with reference to FIG. 45.

Figure 45A:
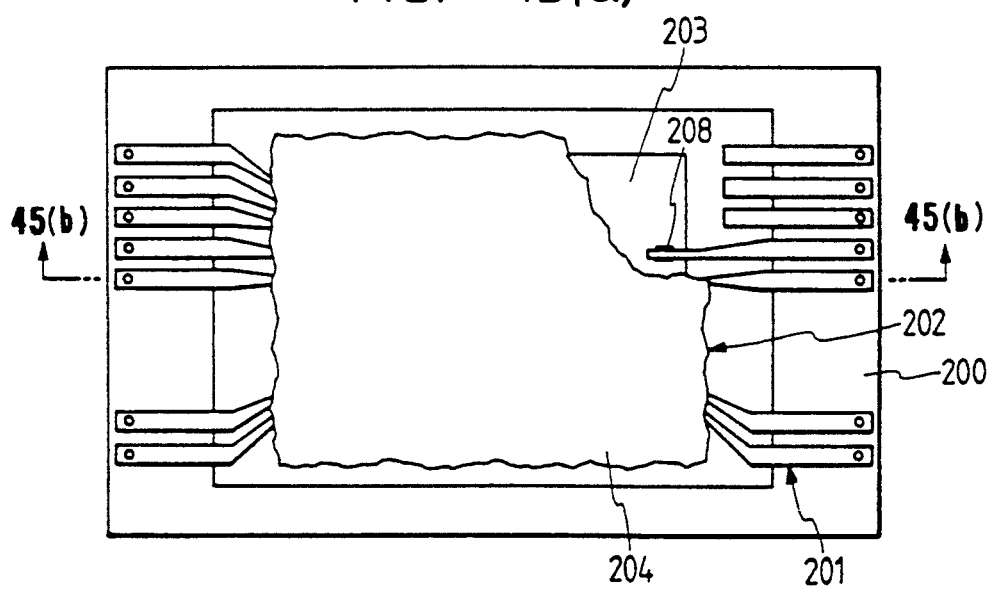
FIGS. 45(a) and 45(b) are a top plan view and a side elevation showing another example of the semiconductor device with connectors.
Figure 45B:
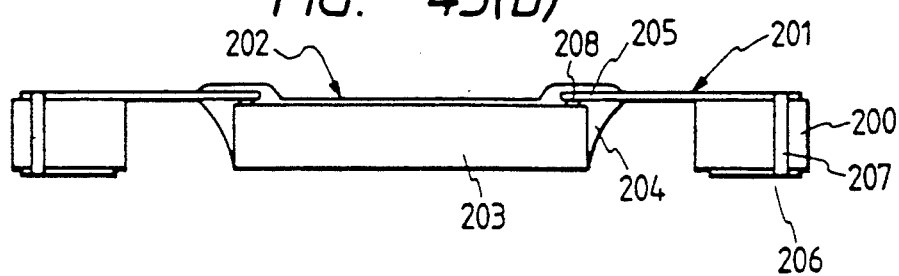

FIG. 45(a) is a top plan view showing a film carrier semiconductor module according to the Embodiment II. FIG. 45(b) is a section taken along line Z—Z' of FIG. 45(a).

As shown in FIG. 45, a connector 200 with leads has its surface formed with a surface pattern such that a lead pattern extended to an inner lead 205 is fixed. The back of the connector 200 is formed with a back pattern 206, which is electrically connected with the surface pattern through the through holes 207.

A bump 208 formed on a semiconductor chip 203 is electrically connected with the inner leads 205. The semiconductor chip 203 including the connecting portions has its surface and sides coated with a protective coating 204.

The connector 200 with the leads is formed by punching the substrate, which has a pattern conductive material fixed on one side of its base, to form a hole for fitting the semiconductor chip 203 therein, by adhering a conductive material as well as the holed portion for forming the lead pattern to the other side and by using the fabrication process of the printed wiring plate, thus forming the connector 200 having the lead pattern extended to one end of its base, as shown in FIG. 45.

The bonding of the connector 200 and the semiconductor chip 203 is accomplished by the well-known inner lead bonding method using gold-gold or gold-tin. The stacking of a film carrier semiconductor module 202 using the present connector 200 needs no first connecting portion 14a shown in FIG. 14 so that it is highly advantageous for the assembly step.

Embodiment III

The Embodiment III of the present invention will be described with reference to FIGS. 46 to 55.

Figure 46:
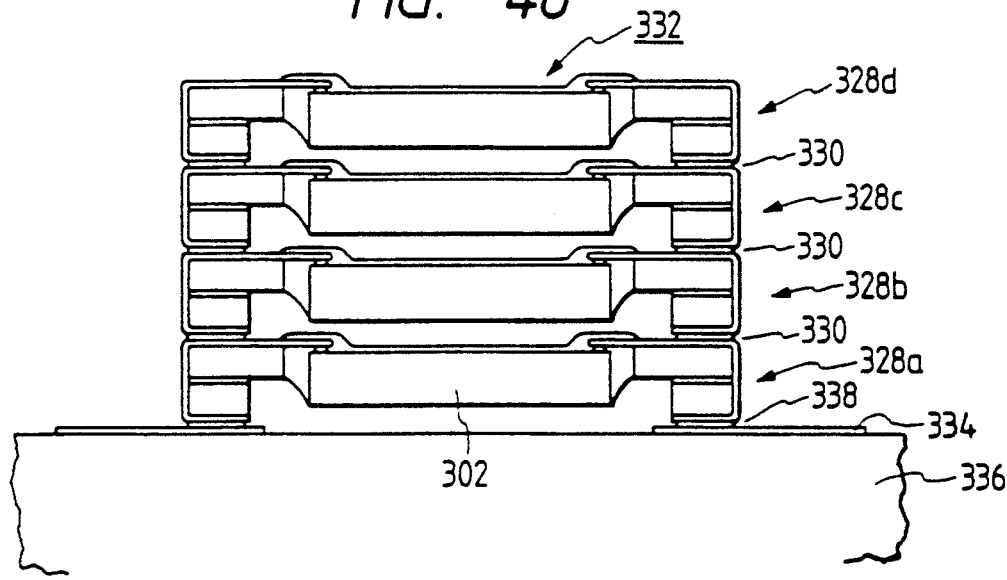
FIG. 46 is a section showing a multi-chip semiconductor device according to the present invention, respectively.
Figure 47:
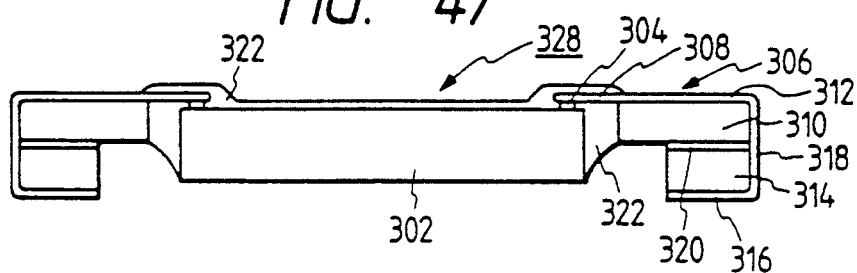
FIGS. 47 and 48 are a section and a top plan view showing a film carrier semiconductor device respectively.
Figure 48:
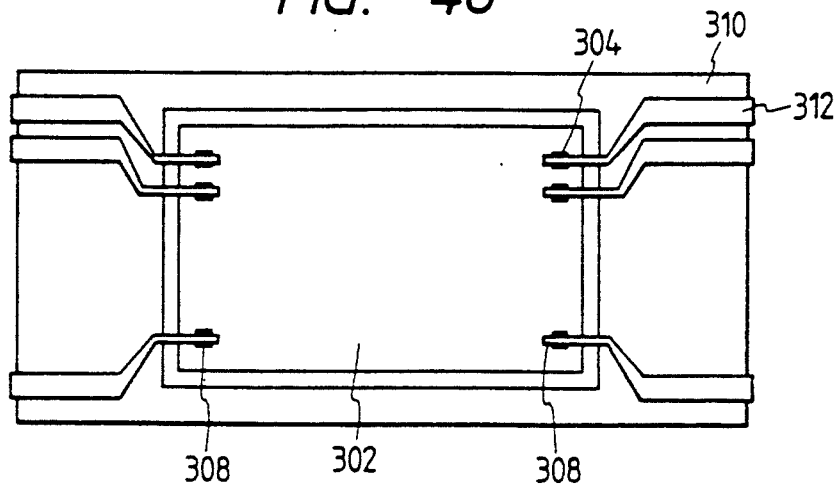

FIG. 46 is a section of a multi-chip semiconductor device 332 according to the present invention, in which four film carrier semiconductor devices 28 shown in FIGS. 47 and 48 are stacked and electrically connected.

FIG. 47 is a section showing the single film carrier semiconductor device 28 according to the present invention, in which the based outer leads are bent, and FIG. 48 is a top plan view of FIG. 47.

First of all, as shown in FIGS. 47 and 48, a semiconductor chip 302 is formed with bumps 304, through which it is electrically connected with inner leads 308 of a film carrier tape 306.

The film carrier tape 306 is formed with a frame base 310, a surface pattern 312 formed on the surface of the frame base 310, a bending base 314, a back pattern 316 formed on the surface of the bending base 314, a connecting pattern 318 for connecting the surface pattern 312 and the back pattern 316, and a fixing layer 320 for fixing the frame base 310 and the bending base 314. Thus, a film carrier semiconductor device 328 is formed by applying a resin 322 to the surface of the chip 302 including the inner lead bonding portion and to the sides of the frame base 310 and the chip 302.

FIG. 48 shows the state in which the resin 322 is removed to make the inner lead bonding portion more visible.

The same reference numerals of FIG. 46 as those of FIGS. 47 and 48 designate the same contents. Of the four film carrier semiconductor devices 328: the lowermost step is accompanied by letter "a"; the second lower step is accompanied by letter "b"; the third lower step is accompanied by letter "c"; and the fourth lower step is accompanied by letter "d". Incidentally, the same reference numerals appearing in the accompanying drawings will designate the same contents.

In FIG. 46, the film carrier semiconductor devices 328a to 328d are bonded by inter-layer connecting layers 330 to form the multi-chip semiconductor device 332. This multi-chip semiconductor device 332 is connected through a connecting layer 338 with a substrate 336 which has its surface formed with a wiring pattern 334.

Figure 49G:
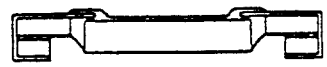
Figure 49G:
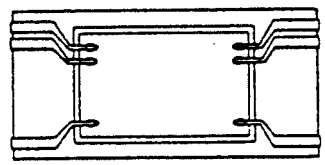

FIG. 49 presents sections and top plan views showing the steps of fabricating the film carrier semiconductor device according to the Embodiment III of the present invention. FIG. 49(a) presents an inner lead bonding step for bonding the bump 304 and the inner lead 308 over the chip 302. The semiconductor chip 302 is electrically connected with the film carrier tape having a device hole 341, a square hole 342 formed below the connecting pattern 318, a square hole 346 formed below a holding lead 344 and the inner lead 308. FIG. 49(b) presents the step of applying the resin 322 to the surface of the chip portion and the periphery of the inner lead bonding portion. FIG. 49(c) presents the step of applying an adhesive 340 for adhering the bent frame base 310 and the bending base 314. FIGS. 49(d) and 49(d') present the step of cutting the holding lead 344 and the bending base 314 partially. FIGS. 49(e) and 49(f) present the bending steps, and FIGS. 49(g) and 49(g') present the contouring steps. Incidentally, the feed and positioning of the film carrier tape between the steps are accomplished with respect to sprocket holes 315 of FIG. 49(d').

Figure 50:
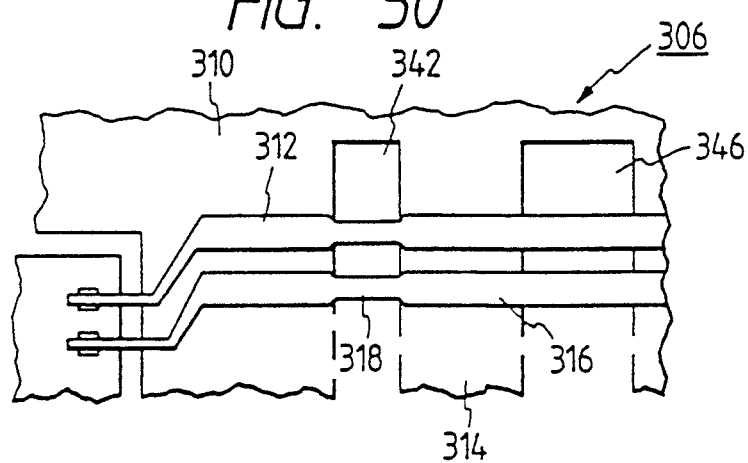
Figure 51:
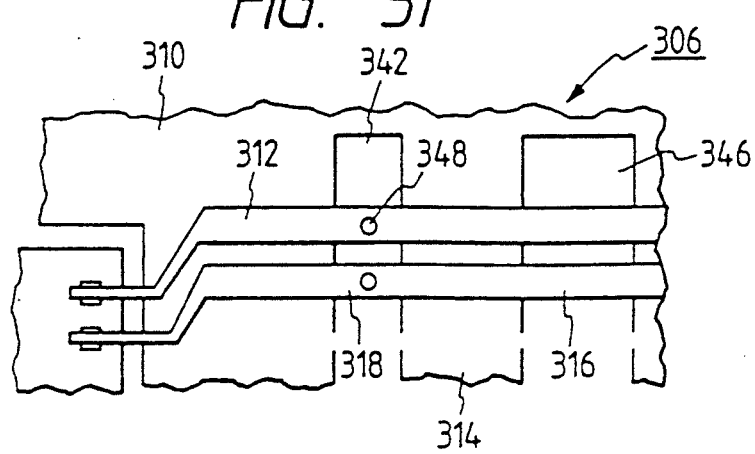

FIGS. 50 to 52 are top plan views showing a portion of the outer leads before they are bent. As shown: the film carrier tape 306 is formed with the square holes 342 and 346; the frame base 310 is formed thereon with the surface pattern 312; the bending base 314 is formed thereon with the back pattern 316; and the square hole 342 is formed with the connecting pattern 318. As shown in FIG. 51, on the other hand, the connecting pattern 318 is formed with holes 348.

FIGS. 53 and 54 are sections showing the connecting pattern 318. FIG. 53 shows a thin portion 350 all over the connecting pattern 318, and FIG. 54 shows the thin portion locally.

Next, the details and operations of the individual portions of the multi-chip semiconductor device and the film carrier semiconductor device according to the present invention will be described in the following.

In FIG. 46, the semiconductor chip 302 is a memory semiconductor chip in which memory elements are integrated. The data are written in and read out in response to signals fed from the substrate 336.

The flows of the electric signals for writing and reading the data are accomplished such that the signals are fed from the outside to the wiring pattern 334 on the substrate 336 and are fed through the connecting layer 338 to the respective terminals of the multi-chip semiconductor devices 328a to 328d. Here, the circuit is so designed that the electric signals fed to the individual terminals are effective only of that one of the film carrier semiconductor devices 328a to 328d, which is selected by the chip select pattern, while leaving the film carrier semiconductor devices unselected being inoperative. The chip selecting method to be used is similar to the aforementioned ones of the Example I and Example II (FIG. 42).

The construction and fabrication method of the single film carrier semiconductor device 328 will be described with reference to FIGS. 47, 48 and 49. The film carrier tape 306 is formed according to the well-known film carrier tape process by punching the glass epoxy base the device hole 344 for the semiconductor chip 302 and the square holes 342 and 344, by applying a copper foil to one side of the base, and by forming the necessary circuit pattern.

The semiconductor chip 302 is formed by the well-known bump forming process with the bumps 304 to be connected with the inner leads 308 of the film carrier tape 306.

The inner leads 308 of the film carrier tape 306 and the bumps 304 of the semiconductor chip 302 are positioned and metallically connected, as shown in FIG. 49(a). The bonding method to be used is to apply a heated heater tip to the connecting portion.

Next, as shown in FIG. 49(b), the resin 322 is applied to set to the surface of the bonded semiconductor chip 302, the sides of the semiconductor chip 302 and a certain portion of the frame base 310. The resin is used to protect the inner lead connecting portions from corrosion and mechanically and is exemplified by a thermoset epoxy resin but should not limit its material and setting method.

Next, as shown in FIG. 49(c), the adhesive 340 is applied to the lower face of the frame base 310, and the holding leads 344 and the bending base 314 are cut at their sides as shown in FIG. 49(d) and 49(d').

After these cutting operations, the bending base 314 and the back pattern 316 are supported by the connecting pattern 318 only.

Next, as shown in FIGS. 49(e) and 49(f), the connecting pattern 318 is bent to face and fix the lower face of the frame base 310 and the lower face of the bending base 314 by means of the adhesive 310. After this, the film carrier semiconductor device shown in FIGS. 49(g) and 49(h) is fabricated by cutting the contour.

This contouring is accomplished with reference to the sprocket holes 315 of the film carrier tape 306. As a result, the sizing accuracy of the surface pattern 318, which is formed with reference to the sprocket holes 315, is highly excellent.

In the present Embodiment III, the film carrier tape base is made of glass epoxy, but any limitation should not be made to this material.

In FIGS. 50 to 52 the connecting pattern 318 is located at a portion to be bent and is made to have a smaller sectional area than those of the surface pattern 312 and the back pattern 316 so that it may be easily bent.

In FIGS. 50 and 51, the surface pattern 312 and the back pattern 316 are made to have the same width. The connecting pattern 318 is narrowed, as shown in FIG. 50, and is formed with holes, as shown in FIG. 51.

In FIG. 52, the connecting pattern 318 is made narrower than the surface pattern 312, and this surface pattern 312 has a width different from that of the back pattern 316. When the film carrier semiconductor devices after bent are to be stacked, it is intended to prevent the reduction of the gap between the patterns due to the displacement caused between the film carrier semiconductor device at the first step and the film carrier semiconductor device at the second step to be stacked on the first-step one. In other words, the surface and back patterns 312 and 316 are completely overlapped even with a positional shift of one half of the difference of the pattern widths.

FIGS. 53 and 54 show another example for reducing the sectional area of the connecting pattern 318 to reduce the thickness of the leads of the connecting pattern 318 only. Especially, as shown in FIG. 54, a thinned portion 350 is formed near the bending base 314 to improve the bendability.

In FIG. 47, the bending base 314 is made narrower than the frame base 310. This is intended to prevent the pattern near the lower inner leads, e.g., the oblique pattern joining the inner leads 308 and the surface pattern 312, as shown in FIG. 48, from overlying the back pattern 316 of the upper step when the plural film carrier semiconductor devices 328 are stacked, as shown in FIG. 46.

The multi-chip semiconductor device 332 shown in FIG. 46 is prepared by stacking a plurality of film carrier semiconductor devices 328 formed by the method shown in FIG. 49. Here, the method of stacking the film carrier semiconductor devices 328 is accomplished by forming the inter-layer connecting layers 330 of solder between the individual film carrier semiconductor devices 328 and by stacking the film carrier semiconductor devices 328 with reference to the contours. After this, the inter-layer connecting layers 330 are heated to melt the solder, thus ending the inter-layer connections. Incidentally, four film carrier semiconductor devices 328 are stacked, as shown in FIG. 46, but the number of the devices 328 should not be limited to four. On the other hand, the inter-layer connecting layers 330 are made of solder, but their material should not be limited thereto and can be exemplified by a solder comprised mainly of tin and gold, an anisotropic conductive adhesive or conductive paste.

Next, FIGS. 55 and 56 show other examples in which the outer leads of the Example III are bent.

FIG. 55 is a section showing a semiconductor device 360 having a connector 362 formed with surface and back patterns 364a and 364b. FIG. 56 is a section showing a semiconductor device 361 having a connector 366 formed with no pattern.

In FIG. 55, the connector 362 is formed with the surface pattern 364a and the back pattern 364b. The surface pattern 364a is connected through a solder layer 365 with an outer lead portion 363a, and a bent outer lead portion 363b has its leading end connected through the solder 365 with the back pattern 364b.

In FIG. 56, the connector 366 is formed with neither the surface pattern nor the back pattern and is connected directly with the outer lead portions 363a and 363b through an adhesive 367.

As described above, according to the present Embodiment III, a film carrier semiconductor device having wires on its two faces can be formed by the simple process using the film carrier tape having its one side wired. Since, moreover, the outer lead portions with the base are bent, the film carrier tape having a base thickness of about one half of the chip thickness can be used to apply the film carrier tape fabricating process of the prior art. Since, still moreover, the outer leads have their portions bent directly, the surface pattern width can be sufficiently reduced to reduce the size of the module. Since, furthermore, the film carrier tapes are individually contoured, the sizing accuracy of the patterns and the contours is so excellent as to effect the positioning with respect to the contours when the film carrier semiconductor devices are stacked. Since the performance of the film carrier semiconductor device can be completely inspected by itself, on the other hand, only excellent devices can be combined to provide the multi-chip semiconductor device with an excellent yield.

Next, the process for fabricating the semiconductor device having a connector according to the present invention will be described with reference to FIGS. 57 to 63.

Figure 57:
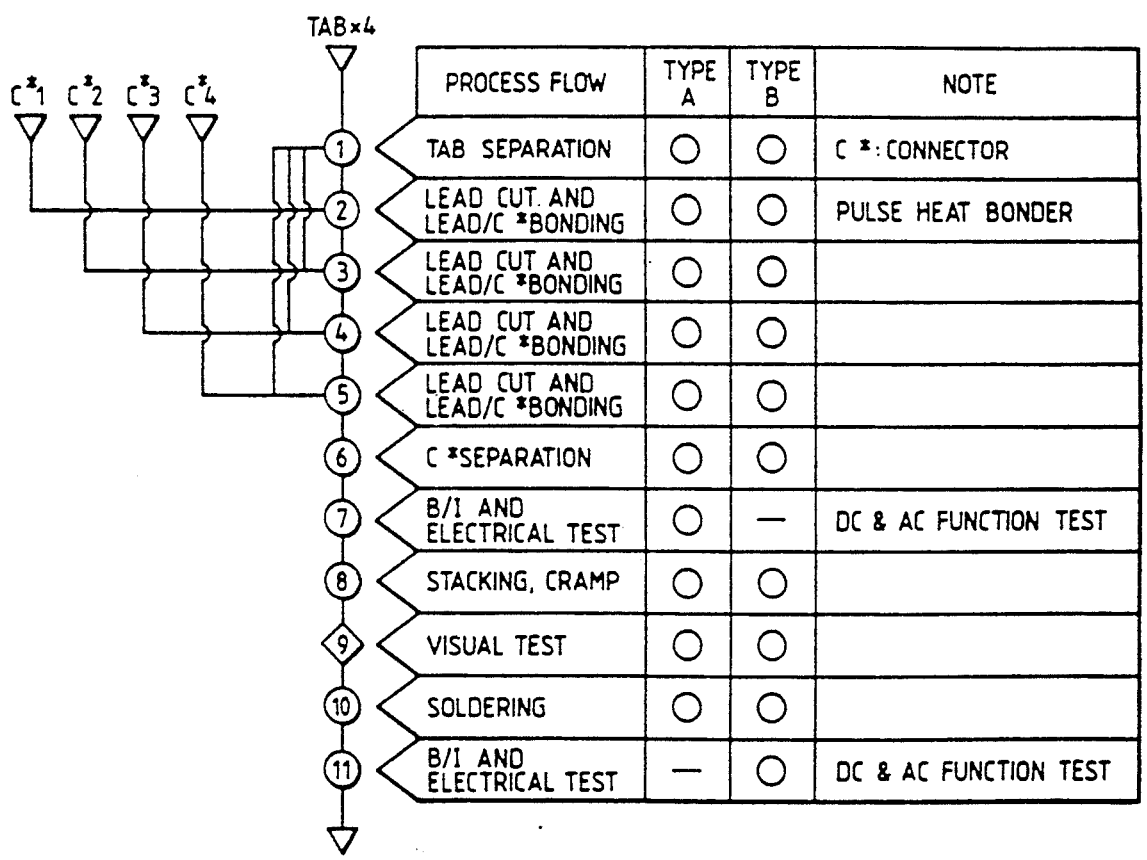
FIGS. 57 to 62 are flow charts showing the fabrication process of the multi-chip semiconductor of the present invention.

First of all, FIG. 57 is a flow chart showing the process for fabricating the semiconductor device having the connector shown in FIGS. 16, 18 and 33.

In the type A of FIG. 57, a polyimide resin film tape is formed by the ordinary etching technique with a copper wiring pattern, on which a semiconductor chip is mounted by the inner lead bonding. A plurality of series TABs thus formed are separated (at Step 1) into individual TABs. Next, excess lead patterns are cut from the individual TABs, and these TABs are mounted by the use of a pulse heat bonder under the conditions of 250° C. and 1 to 2 seconds on four kinds of connectors each composed of four (at Steps 2 to 5). The connectors mounting the TABs are separated (at Step 6) into individuals. These TABs with connectors are tested (at Step 7) in respect of the barn-in and electric characteristics. Then, the TABs with the connectors are stacked and clamped (at Step 8) and visually tested (at Step 9) and are soldered (at Step 10) to complete the stacked TAB module, i.e,. the multi-chip semiconductor device of the Embodiment I.

Since the characteristic tests are accomplished after the connector separation, the defectives can be eliminated before the stacking so that the stacked TAB module can have an improved yield.

In the type B of FIG. 57, on the other hand, the barn-in and electric characteristic tests are accomplished (at Step 11) at the stage in which the stacked TAB module is completed.

Figure 58:
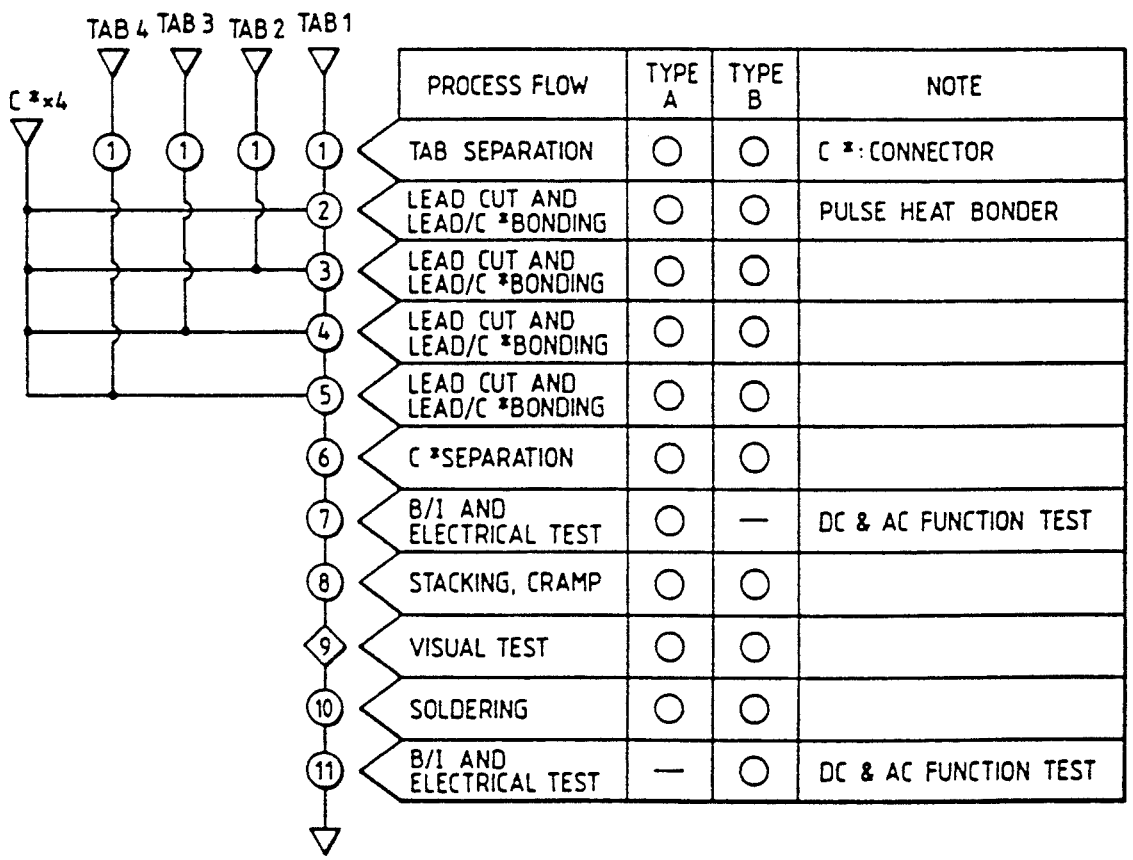

FIG. 58 is a flow chart showing the process for fabricating the semiconductor device with the connector shown in FIGS. 41 and 43.

In the type A of FIG. 58, either the TABs, which are prepared by the inner lead bonding of the semiconductor chips to four kinds of film tapes formed with different copper wiring patterns, or the TABs, which are prepared by the inner lead bonding of the lead patterns having shapes shown in FIG. 43 to four kinds of different semiconductor chips, are separated (at Step 1) into individuals. Next, excess lead patterns are cut from the individual TABs, and four kinds of TABs are bonded by the use of the pulse heat bonder under the conditions of 250° C. and 1 to 2 seconds to the connector boards of the same kinds (at Steps 2 to 5). The subsequent steps are similar to those (6 to 10) of FIG. 57 to complete the stacked TAB module.

In the type B of FIG. 58, too, the aforementioned Steps (1 to 11) are used for the description of FIG. 58.

Figure 59:
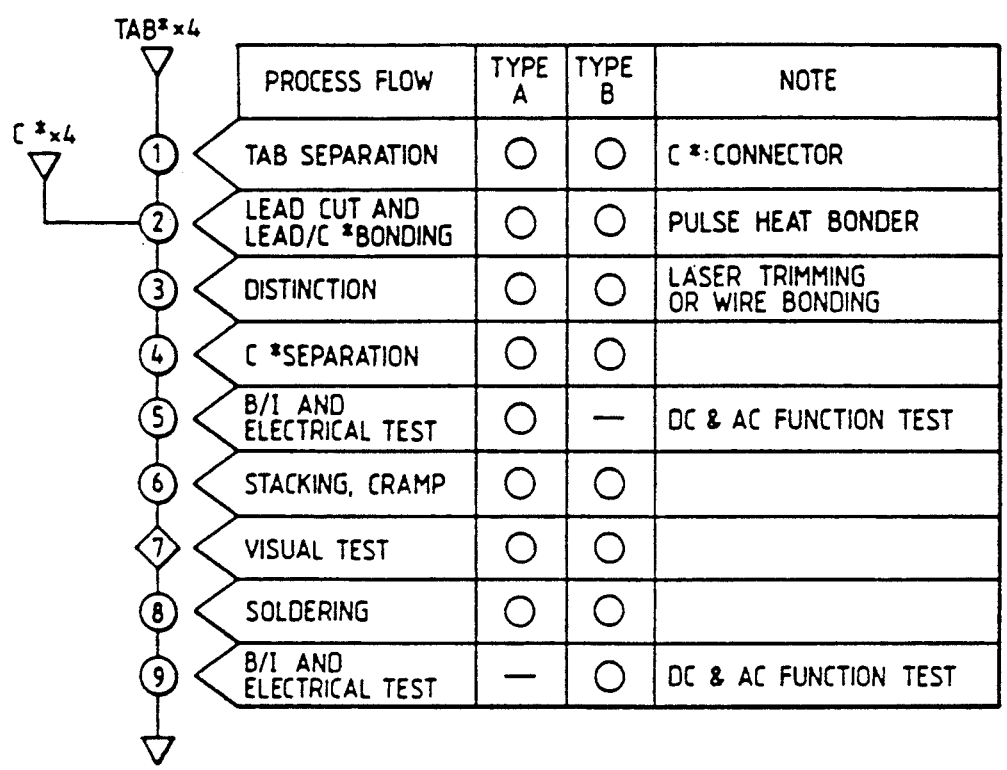

FIG. 59 is a flow chart showing the process for fabricating the semiconductor device with the connector shown in FIG. 42.

In the type A of FIG. 59, four TABs of the same kind prepared by the ordinary TAB method are prepared (at Process 1) and are bonded (at Step 2) at 250° C. for 1 to 2 seconds to the connectors of the same kind. Next, as shown in FIG. 42, the excess lead patterns are cut by means of a laser beam while leaving only the necessary lead patterns as they are, or only the necessary patterns are connected (at Step 3) by the wiring bonding. The subsequent steps (4 to 8) are the same as those (6 to 10) described with reference to FIG. 57, to complete the stacked TAB module.

In the type B of FIG. 59, too, the steps (1 to 9) cover the description of FIG. 59.

Figure 60:
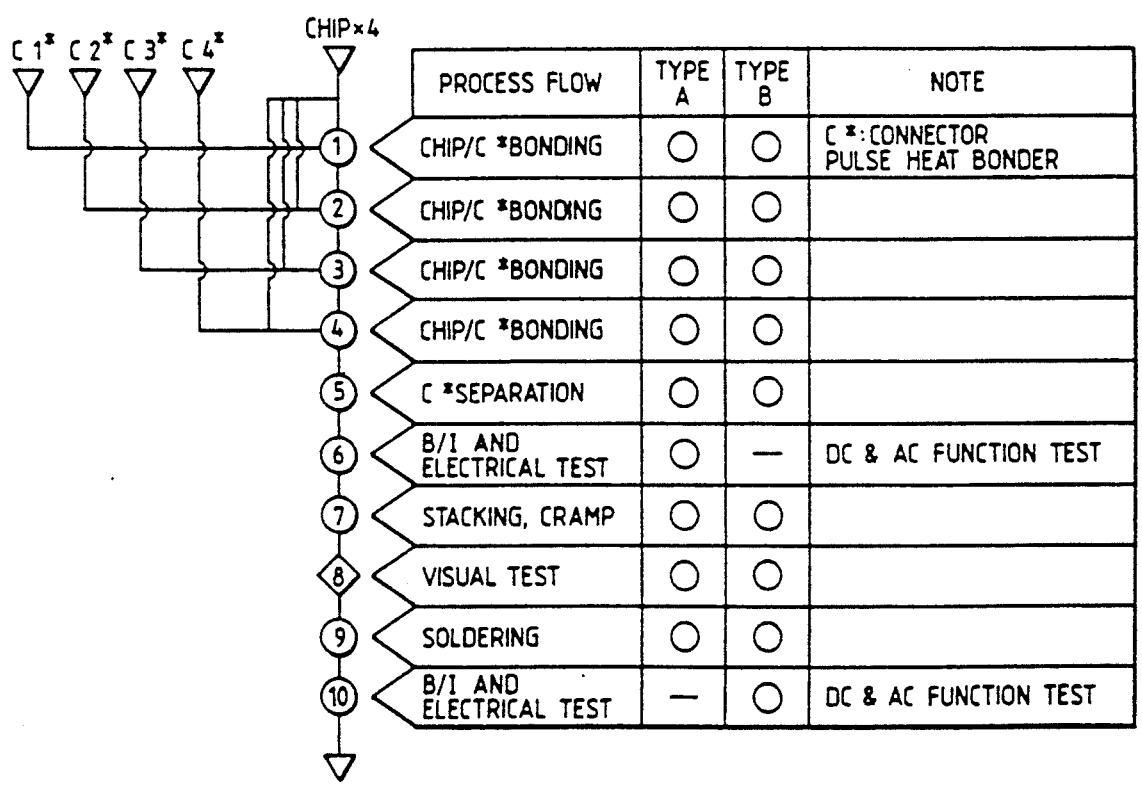

FIG. 60 is a flow chart showing the process for fabricating the semiconductor device with the connector shown in FIG. 45.

In the type A of FIG. 60, semiconductor chips (e.g., dies or pellets) formed by the ordinary process are prepared and are inner-lead bonded to the connectors, to which leads are attached in advance, by the use of the pulse heat bonder under the conditions of 250° C. and 1 to 2 seconds (at Steps 1 to 4). Here, the connectors with the leads are individually formed in the same shapes as those of the connector surface and back lead patterns of FIG. 16 of the Embodiment I in accordance with the stacking positions. The subsequent steps (5 to 9) are identical to those (6 to 10) described with reference to FIG. 57, thus completing the stacked module.

In the type B of FIG. 60, too, the steps (6 to 11) of FIG. 57 cover the description of FIG. 60.

Figure 61:
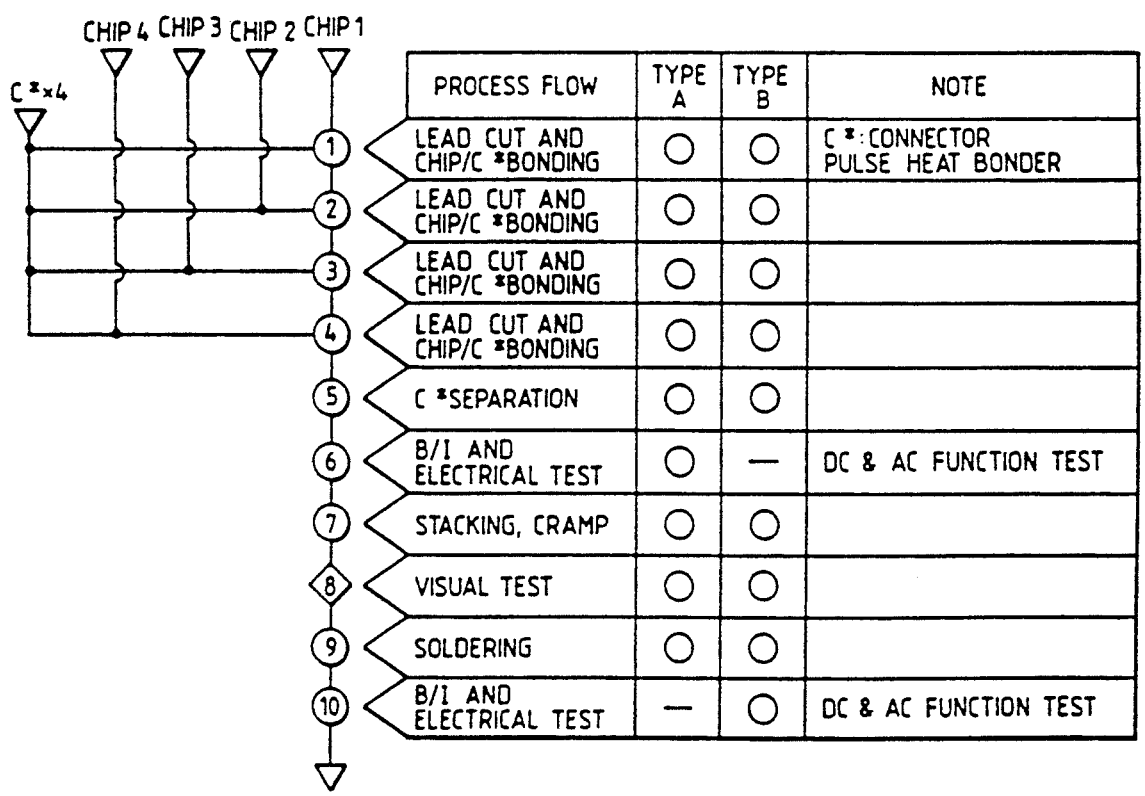

FIG. 61 is a flow chart showing the process for fabricating the semiconductor device with the connector shown in FIG. 45, in case four kinds of semiconductor chips (or dies) are applied, as shown in FIG. 43.

In the type A of FIG. 61, four kinds of semiconductor chips shown in FIG. 43 are prepared according to the individual stacking steps and are bonded to the connectors with leads by the use of the pulse heat bonder under the conditions of 250° C. and 1 to 2 seconds (at Steps 1 to 4). The subsequent steps (5 to 9) are similar to the steps (6 to 10) described with reference to FIG. 57, thus completing the stacked module.

In the type B of FIG. 61, the steps (6 to 11) of FIG. 57 covers the description of FIG. 61.

Figure 62:
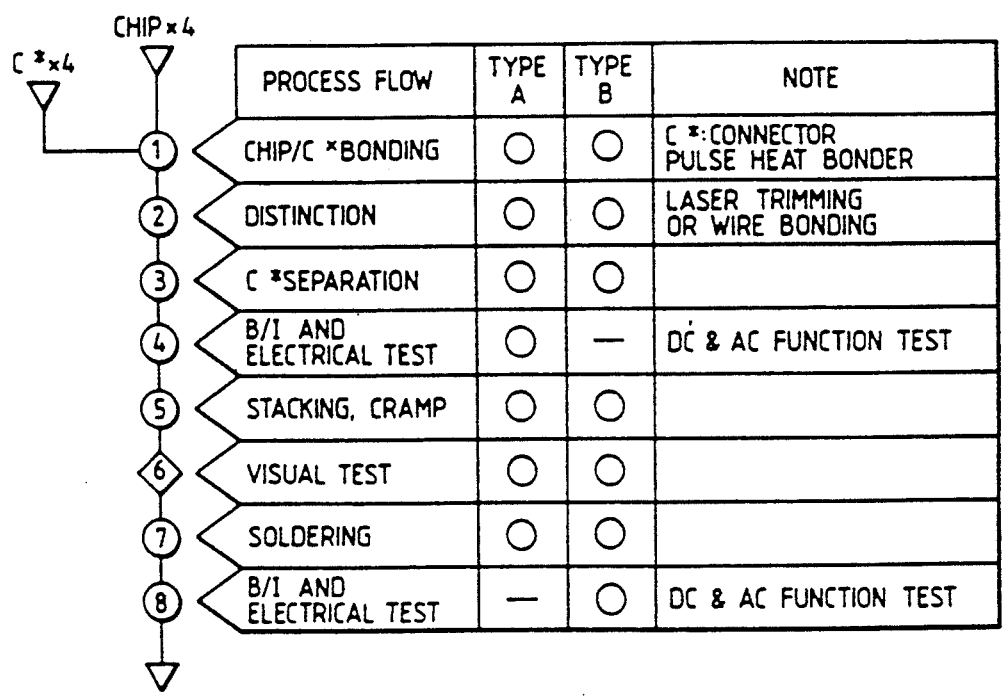

FIG. 62 is a flow chart showing the process for fabricating the semiconductor device with a connector shown in FIG. 45, in case only necessary lead patterns are connected, as shown in FIG. 42.

In the type A of FIG. 62, four semiconductor chips (e.g., dies or pellets) and four connectors, to which leads are attached in advance, are prepared and are bonded (at Step 1) by the use of the pulse heat bonder under the conditions of 250° C. and 1 to 2 seconds. Excess lead patterns except the necessary patterns only are cut by means of a laser beam, or only the necessary lead patterns are connected by the wire bonding (at Step 2). The subsequent steps (3 to 7) are identical to those (6 to 10) described with reference to FIG. 57, thus completing the stacked module.

In the type B of FIG. 62, too, the steps (6 to 11) of FIG. 57 cover the description of FIG. 62.

Figure 63:
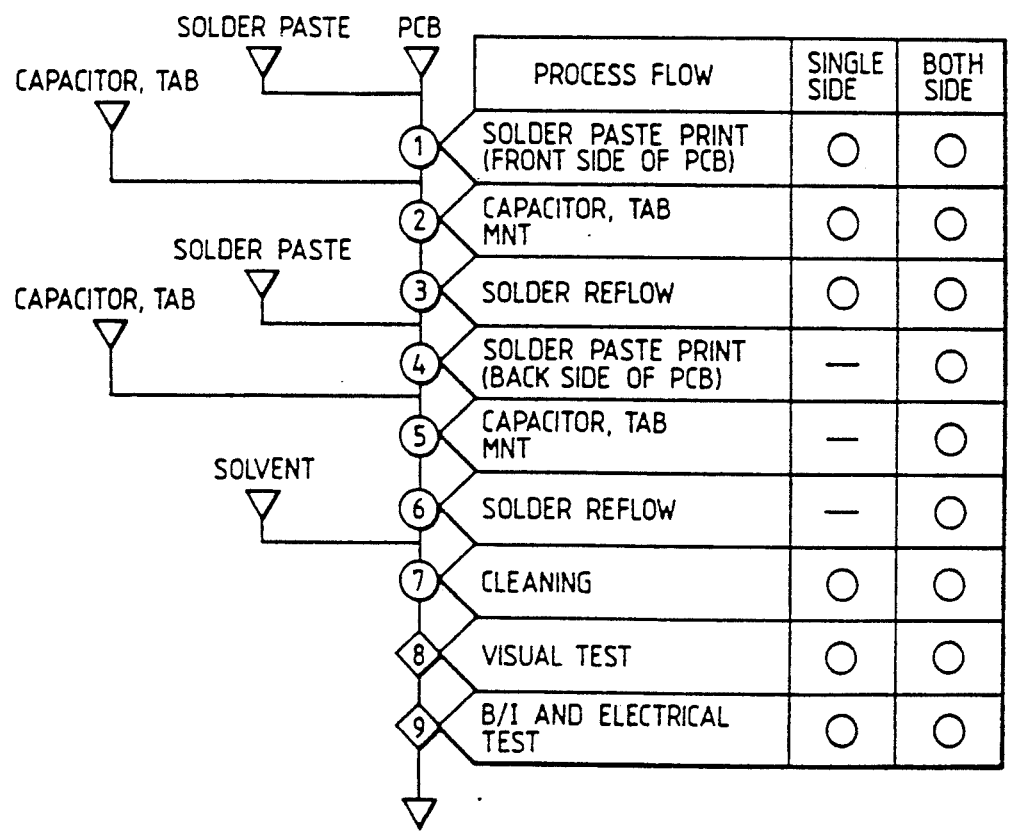
FIG. 63 is a flow chart showing the fabrication process of the multi-chip semiconductor module according to one example of the present invention.

FIG. 63 is a flow chart showing the process for fabricating the semiconductor module shown in FIG. 24.

In the (single side) semiconductor module of FIG. 63, solder paste is printed (at Step 1) on the surface (or front side) of the printed wiring substrate. Next, the chip capacitor and the stacked TAB module disclosed in the Embodiments I to III are mounted (at Step 2), and the solder is reflown (at Step 3). Here, the conditions are at 215° C. and for 30 seconds for the paper reflow and at 230° C. and for 5 seconds for the infrared ray reflow. The flux is removed through an organic solvent, and the module is cleaned (at Step 7). After this, the single-side semiconductor module is completed through a visual test (at Step 8) and a barn-in and electrical test (at Step 9).

In the both-side semiconductor module of FIG. 63, the mounting of the stacked TAB module on the surface of the printed wiring substrate is similar to the single-side semiconductor module up to the steps (1 to 3). In the case of the both-side mounting, after a solder reflow step (3), the back (or back side) of the printed wiring substrate is printed (at Step 4) with solder paste, and the chip capacitor and the aforementioned stacked TAB module are mounted (at Step 5), followed by the solder reflow (at Step 6). Then, the aforementioned cleaning and test steps complete the both-side semiconductor module.

What is claimed is:

1. A semiconductor memory device comprising:
    first and second semiconductor memory chips which are stacked one above the other, each of said memory chips having first and second principal surfaces with a plurality of first electrodes and a second electrode being located on the first principal surface; and
    first and second connectors, each having a plurality of first conductors arranged on a first surface and a plurality of second conductors arranged on a second surface which is opposite to said first surface, said first conductors being electrically connected to respective ones of said second conductors,
    wherein said first electrodes and said second electrode formed on said first memory chip are electrically connected to respective conductors of said first conductors of said first connector, wherein said first electrodes and said second electrode formed on said second memory chip are electrically connected to respective conductors of said first conductors of said second connector, wherein said first and second connectors are stacked one above the other, wherein said second conductors of said first connector are electrically connected to respective conductors of said first conductors of said second connector, wherein said first electrodes of said first memory chip are electrically connected to respective electrodes of said first electrodes of said second memory chip via said first and second conductors, and wherein said second electrode of said first memory chip is electrically independent of said second electrode of said second memory chip.

2. A semiconductor memory device according to claim 1, wherein a distance between said first surface and said second surface of each of said first and second connectors is larger than that between said first principal surface and said second principal surface of the associated one of said first and second semiconductor memory chips.

3. A semiconductor memory device according to claim 1, wherein said second electrode of said first semiconductor memory chip receives a signal for selecting said first semiconductor memory chip.

4. A semiconductor memory device according to claim 3, wherein said signal for selecting said first semiconductor memory chip is a row address strobe signal.

5. A semiconductor memory device according to claim 2, wherein said signal for selecting said first semiconductor memory chip is a data input/output signal.

6. A semiconductor memory device according to claim 1, wherein said second electrode of said second semiconductor memory chip receives a signal for selecting said second semiconductor memory chip.

7. A semiconductor memory device according to claim 6, wherein said signal for selecting said second semiconductor memory chip is a row address strobe signal.

8. A semiconductor memory device according to claim 7, wherein said signal for selecting said second semiconductor memory chip is a data input/output signal.

9. A semiconductor memory device according to claim 1, wherein said first electrodes and said second electrode are electrically connected to said first conductors by means of leads which each have one end electrically connected to an electrode and another end electrically connected to a first conductor.

10. A semiconductor memory device according to claim 9, wherein each of said first conductors is electrically connected to a respective one of said second conductors by means of a part of the lead electrically connected to said first conductor which is extended continuously from said another end of said lead.

11. A semiconductor memory device according to claim 9, wherein each of said first conductors is electrically connected to a respective one of said second conductors by means of a through-hole formed in the associated connector.

12. A semiconductor memory device according to claim 9, further comprising:
    another plurality of leads, each having one end which is not electrically connected to said electrodes of said first and second semiconductor memory chips and another end connected to a respective one of said first conductors of said first and second connectors.

13. A semiconductor memory device according to claim 1, further comprising:
    a resin for sealing said first principal surfaces of said first and second memory chips and said electrodes.

14. A semiconductor memory device according to claim 1, wherein each of said first and second electrodes is a bump electrode.

15. A semiconductor memory device according to claim 1, wherein four of said connectors are stacked.

16. A semiconductor memory device according to claim 1, wherein said connectors are made of glass epoxy.

17. A semiconductor memory device according to claim 1, wherein said connectors are made of ceramic.

18. A semiconductor memory device according to claim 1, wherein said connectors are made of a polyimide resin.

19. A semiconductor memory device comprising:
    first and second semiconductor memory chips which are stacked one above the other, each having first and second principal surfaces, each of said first and second semiconductor memory chips having a plurality of first electrodes and a second electrode on said first principal surface;
    first and second connectors, each having a plurality of first conductors arranged on a first surface and a plurality of second conductors arranged on a second surface which is opposite to said first surface, said first conductors being electrically connected to respective ones of said second conductors; and a substrate having a main surface and a rear surface, a plurality of first and second wiring patterns formed on said main surface, wherein said first electrodes and said second electrode formed on said first memory chip are electrically connected to respective conductors of said first conductors of said first connector, wherein said first electrodes and said second electrode formed on said second memory chip are electrically connected to respective conductors of said first conductors of said second connector, wherein said first and second connectors are stacked one above the other, wherein said second conductors of said first connector are electrically connected to respective conductors of said first conductors of said second connector, wherein said first electrodes of said first memory chip are electrically connected to each of said first electrodes of said second memory chip via said first and second conductors, and wherein said second electrode of said first memory chip is electrically independent of said second electrode of said second memory chip.

20. A semiconductor memory device according to claim 19, wherein said substrate has a plurality of first terminals and a plurality of second terminals, wherein each of said first electrodes of said first and second memory chips is electrically connected to a respective terminal of said first terminals via said wiring patterns, wherein said second electrode of said first memory chip is electrically connected to one of said second terminals via said wiring pattern, and wherein said second electrode of said second memory chip is electrically connected to another one of said second terminals via said wiring pattern.

21. A semiconductor memory device according to claim 19, wherein a distance between said first surface and said second surface of each of said first and second conductors is larger than that between said first principal surface and said second principal surface of the associated one of said first and second semiconductor memory chips.

22. A semiconductor memory device according to claim 19, wherein said second electrode of said first semiconductor memory chip receives a signal for selecting said first semiconductor memory chip.

23. A semiconductor memory device according to claim 22, wherein said signal for selecting said first semiconductor memory chip is a row address strobe signal.

24. A semiconductor memory device according to claim 22, wherein said signal for selecting said first semiconductor memory chip is a data input/output signal.

25. A semiconductor memory device according to claim 19, wherein said second electrode of said second semiconductor memory chip receives a signal for selecting said second semiconductor memory chip.

26. A semiconductor memory device according to claim 25, wherein said signal for selecting said second semiconductor memory chip is a row address strobe signal.

27. A semiconductor memory device according to claim 26, wherein said signal for selecting said second semiconductor memory chip is a data input/output signal.

28. A semiconductor memory device according to claim 19, wherein said first electrodes and said second electrodes are electrically connected to said first conductors by means of leads which each have one end electrically connected to an electrode and another end electrically connected to a first conductor.

29. A semiconductor memory device according to claim 28, wherein each of said first conductors is electrically connected to a respective one of said second conductors by means of a part of the lead electrically connected to said first conductor which is extended continuously from said another end of said lead.

30. A semiconductor memory device according to claim 28, wherein each of said first conductors is electrically connected to a respective one of said second conductors by means of a through-hole formed in said connectors.

31. A semiconductor memory device according to claim 28, further comprising:
another plurality of leads, each having one end which is not electrically connected to said electrodes of said first and second semiconductor memory chips and another end connected to a respective one of said first conductors of said first and second connectors.

32. A semiconductor memory device according to claim 19, further comprising:
a resin for sealing said first principal surfaces of said first and second memory chips and said electrodes.

33. A semiconductor memory device according to claim 19, wherein each of said first and second electrodes is a bump electrode.

34. A semiconductor memory device according to claim 19, wherein four of said connectors are stacked.

35. A semiconductor memory device according to claim 19, wherein said connector is made of glass epoxy.

36. A semiconductor memory device according to claim 19, wherein said connectors are made of ceramic.

37. A semiconductor memory device according to claim 19, wherein said connectors are made of a polyimide resin.

38. A semiconductor memory module comprising:
first and second semiconductor memory devices, each of said first and second semiconductor memory devices comprising:
first and second semiconductor memory chips which are stacked one above the other, each of said memory chips having first and second principal surfaces with a plurality of first electrodes and a second electrode being located on the first principal surface;
first and second connectors, each having a plurality of first conductors arranged on a first surface and a plurality of second conductors arranged on a second surface which is opposite to said first surface, said first conductors being electrically connected to respective ones of said second conductors,
wherein said first electrodes and said second electrode formed on said first memory chip are electrically connected to respective conductors of said first conductors of said first connector, said first electrodes and said second electrode formed on said second memory chip are electrically connected to respective conductors of said first conductors of said second connector, wherein said first and second connectors are stacked one above the other, said second conductors of said first connector are electrically connected to respective conductors of said first conductors of said second connector, and wherein said first electrodes of said first memory chip are electrically connected to respective electrodes of said first electrodes of said second memory chip via said first and second conductors, said second electrode of said first memory chip is electrically independent of said second electrode of said second memory chip; and
a substrate having a main surface and a rear surface, said semiconductor memory devices being mounted on said main surface of said substrate.

39. A semiconductor memory module according to claim 38, further comprising:
a logic decoder having a plurality of terminals, and
wherein said substrate has a plurality of first terminals and a plurality of second terminals, wherein each of said first electrodes which are electrically connected to each other, on said first and second memory chips of said first memory device and each of said first electrodes, which are electrically connected to each other, on said fist and second memory chips of said second memory device are electrically connected to each of said first terminals, and wherein each of said second electrodes of said first and second memory chips is electrically connected to a respective one of said second terminals via said logic decoder.

40. A semiconductor memory module according to claim 38, wherein a distance between said first surface and said second surface of each of said first and second connectors is larger than that between said first principal surface and said second principal surface of the associated one of said first and second semiconductor memory chips.

41. A semiconductor memory module according to claim 38, wherein each of said second electrodes of said first and second semiconductor memory chips of said first semiconductor memory device receives a signal for selecting each of said first and second semiconductor memory chips.

42. A semiconductor memory module according to claim 38, wherein each of said second electrodes of said first and second semiconductor memory chips of second semiconductor memory device receives a signal for selecting each of said first and second semiconductor memory chips.

43. A semiconductor memory module according to claim 38, wherein said first electrodes and said second electrodes are electrically connected to said first conductors by means of leads which each have one end electrically connected to an electrode and another electrically connected to a first conductor.

44. A semiconductor memory module according to claim 43, wherein each of said first conductors is electrically connected to a respective one of said second conductors by means of a part of the lead electrically connected to said first conductor which is extended continuously from said another end of said lead.

45. A semiconductor memory module according to claim 43, wherein each of said first conductors is electrically connected to a respective one of said second conductors by means of a through-hole formed in the associated connector.

46. A semiconductor memory module according to claim 38, further comprising:
another plurality of leads, each having one end which is not electrically connected to said first and second electrodes of said first and second semiconductor memory chips and another end connected to a respective one of said first conductors of said first and second connectors.

47. A semiconductor memory module according to claim 38, further comprising:
a resin for sealing said first principal surfaces of said first and second memory chips and said electrodes.

48. A semiconductor memory module according to claim 38, wherein each of said first and second electrodes is a bump electrode.

49. A semiconductor memory module according to claim 38, wherein each of said semiconductor devices has four connectors stacked one above another.

50. A semiconductor memory module according to claim 38, wherein said connectors are made of glass epoxy.

51. A semiconductor memory module according to claim 38, wherein said connectors are made of ceramic.

52. A semiconductor memory module according to claim 38, wherein said connectors are made of a polyimide resin.

53. A semiconductor memory module according to claim 38, wherein said substrate has a plurality of first terminals and a plurality of second terminals, wherein said first electrodes which are electrically connected to each other, on said first and second memory chips of said first memory device are electrically connected to one of said first terminals, wherein said first electrodes, which are electrically connected to each other, on said first and second memory chips of said second memory device are electrically connected to another one of said first terminals, wherein said second electrodes formed on said first memory chips of said first and second memory devices are electrically connected to each other and to one of said second terminals, and wherein said second electrodes formed on said second memory chips of said first and second memory devices are electrically connected to each other and to another one of said second terminals.

54. A semiconductor memory module according to claim 53, wherein each of said first electrodes, which are electrically connected to each other, on said first and second memory chips of said first memory device and each of said first electrodes, which are electrically connected to each other, on said first and second memory chips of said second semiconductor device receives data input/output signals.

55. A semiconductor memory module according to claim 53, wherein said second electrode of said first memory chips are electrically connected to each other and receive a row address strobe signal.

56. A semiconductor memory module according to claim 53, wherein said second electrodes of said second memory chips are electrically connected to each other and receive a column address strobe signal.

* * * * *